(12) United States Patent
Xi et al.

(10) Patent No.: US 12,124,648 B2
(45) Date of Patent: Oct. 22, 2024

(54) ARRAY BASE PLATE AND PREPARING METHOD THEREOF, AND DISPLAY PANEL

(71) Applicants: FUZHOU BOE OPTOELECTRONICS TECHNOLOGY CO., LTD., Fujian (CN); BOE Technology Group Co., Ltd., Beijing (CN)

(72) Inventors: Wenxing Xi, Beijing (CN); Xin Fang, Beijing (CN); Bin Lin, Beijing (CN); Rong Wu, Beijing (CN); Zhenyou Zou, Beijing (CN); Fadian Le, Beijing (CN); Daelim Choi, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/795,703

(22) PCT Filed: Aug. 26, 2021

(86) PCT No.: PCT/CN2021/114784
§ 371 (c)(1),
(2) Date: Jul. 27, 2022

(87) PCT Pub. No.: WO2023/024024
PCT Pub. Date: Mar. 2, 2023

(65) Prior Publication Data
US 2024/0184394 A1    Jun. 6, 2024

(51) Int. Cl.
G06F 3/041    (2006.01)
G02F 1/1362    (2006.01)
(Continued)

(52) U.S. Cl.
CPC .... G06F 3/04164 (2019.05); G02F 1/136286 (2013.01); G02F 1/1368 (2013.01); G06F 3/0446 (2019.05); H01L 27/1244 (2013.01)

(58) Field of Classification Search
CPC ............... G06F 3/04164; G06F 3/0446; G02F 1/136286; G02F 1/1368; H01L 27/1244
See application file for complete search history.

(56) References Cited

U.S. PATENT DOCUMENTS

2015/0185930 A1    7/2015  Xu
2015/0311237 A1*   10/2015 Jo ...................... G02F 1/133345
                                                        257/72

(Continued)

FOREIGN PATENT DOCUMENTS

CN    103728760 A    4/2014
CN    106484157 A    3/2017
(Continued)

*Primary Examiner* — Amit Chatly
(74) *Attorney, Agent, or Firm* — WHDA, LLP

(57) ABSTRACT

The present application provides an array base plate and a preparing method thereof, and a display panel. The array base plate includes a plurality of touch-controlling units that are disposed on the substrate and are arranged in an array, wherein the first electrodes of all of the sub-pixels of the touch-controlling units are electrically connected; a plurality of driving electrode lines, wherein at least part of orthographic projections of the driving electrode lines on the substrate are disposed between orthographic projections on the substrate of two neighboring rows of the first electrodes, and the driving electrode lines are electrically connected to at least one of the first electrodes; in the two neighboring rows of the first electrodes, all of the rows of the first electrodes are arranged in a direction of the driving electrode lines.

19 Claims, 10 Drawing Sheets

(51) Int. Cl.
*G02F 1/1368* (2006.01)
*G06F 3/044* (2006.01)
*H01L 27/12* (2006.01)

(56) References Cited

U.S. PATENT DOCUMENTS

| 2019/0187843 | A1 | 6/2019 | Ye |
| 2020/0097127 | A1* | 3/2020 | Kim ..................... G06F 3/0443 |
| 2021/0173269 | A1* | 6/2021 | Li ........................ G02F 1/1368 |
| 2022/0317488 | A1* | 10/2022 | Shiina ............... G02F 1/133345 |

FOREIGN PATENT DOCUMENTS

| CN | 107977116 A | 5/2018 |
| CN | 110941360 A | 3/2020 |
| CN | 112181201 A | 1/2021 |
| CN | 113204292 A | 8/2021 |
| WO | 2020/047712 A1 | 3/2020 |
| WO | 2021/114282 A1 | 6/2021 |

* cited by examiner

ARRAY BASE PLATE AND PREPARING METHOD THEREOF, AND DISPLAY PANEL

TECHNICAL FIELD

The present application relates to the technical field of displaying, and particularly relates to an array base plate and a preparing method thereof, and a display panel.

BACKGROUND

With the quick development of the technique of touch-controlled display screens and the increasingly higher market demand on touch-controlled display screens, the technique of touch-controlled displaying has become an indispensable component of human-machine interaction, and is extensively applied in industries such as education, commerce, finance and service and so on.

Currently, capacitance-type touch-controlled screens designed based on the technique of In Cell Touch have characteristics such as a low production cost, a high stability and a good technical effect of touch controlling, and have occupied the mainstream market. In the technique of In Cell Touch, the touch controlling electrodes are disposed inside the display panel, which has a high requirement on the design of the pixels, which results in many problems in imperfect checkout and repairing, thereby highly reducing the yield and increasing the production cost, which is adverse to the product promotion.

SUMMARY

The embodiments of the present application provide an array base plate and a preparing method thereof, and a display panel, wherein the array base plate has a high yield and a low production cost.

In order to achieve the above object, the embodiments of the present application employ the following technical solutions:

In an aspect, there is provided an array base plate, wherein the array base plate includes:

a substrate;

a plurality of touch-controlling units that are disposed on the substrate and are arranged in an array, wherein each of the touch-controlling units includes a plurality of sub-pixels arranged in an array; each of the sub-pixels includes a first electrode; the first electrodes of all of the sub-pixels of the touch-controlling units are electrically connected; and the first electrodes are configured for being used as driving electrodes at a displaying stage, and used as touch-controlling sensing electrodes at a touch-controlling stage;

a plurality of driving electrode lines, wherein at least part of orthographic projections of the driving electrode lines on the substrate are disposed between orthographic projections on the substrate of two neighboring rows of the first electrodes, and the driving electrode lines are electrically connected to at least one of the first electrodes; in the two neighboring rows of the first electrodes, all of the rows of the first electrodes are arranged in a direction of the driving electrode lines; each of the driving electrode lines includes one or more disconnection points, and the disconnection points of the driving electrode lines are located at boundaries between two neighboring touch-controlling units that are arranged in the direction of the driving electrode lines; and the driving electrode lines are configured for transmitting driving signals at the displaying stage, and transmitting touch-controlling signals at the touch-controlling stage;

one or more isolating via holes, wherein the isolating via holes are disposed at the boundaries between the two neighboring touch-controlling units that are arranged in the direction of the driving electrode lines, and expose the disconnection points of the driving electrode lines; and one or more isolating and insulating parts, wherein each of the isolating and insulating parts is disposed inside one of the isolating via holes, and fills and levels up the isolating via hole.

Optionally, the driving electrode lines include first electrode lines;

the isolating via holes include first via holes;

the isolating and insulating parts include first insulating parts;

a plurality of the first electrode lines are arranged in a first direction, the first electrode lines are parallel to a row of the first electrodes that are arranged in a second direction, at least part of orthographic projections of the first electrode lines on the substrate are disposed between orthographic projections on the substrate of two neighboring rows of the first electrodes that are arranged in the first direction, and the first electrode lines are electrically connected to the first electrodes in a same one row;

each of the first electrode lines includes a plurality of the disconnection points, and the disconnection points of the first electrode lines are located at boundaries between any two neighboring touch-controlling units that are arranged in the second direction;

the second direction intersects with the first direction;

the first via holes are disposed at the boundaries between the two neighboring touch-controlling units that are arranged in the second direction, and expose the disconnection points of the first electrode lines; and each of the first insulating parts is disposed inside one of the first via holes, and fills and levels up the first via hole.

Optionally, the array base plate further includes an alignment layer, and the alignment layer covers the plurality of touch-controlling units; and the alignment layer and the first insulating parts are of an integral structure.

Optionally, the array base plate further includes an alignment layer, and the alignment layer is disposed on one side of the touch-controlling units that is away from the substrate, and covers the plurality of touch-controlling units;

each of the first insulating parts includes a first insulating sub-part and a second insulating sub-part, the first insulating sub-part is located at one of the disconnection points of the first electrode lines, and the second insulating sub-part is disposed on one side of the first insulating sub-part that is away from the substrate; and the alignment layer and the second insulating sub-part are of an integral structure.

Optionally, the driving electrode lines include second electrode lines;

the isolating via holes include second via holes;

the isolating and insulating parts include second insulating parts;

a plurality of the second electrode lines are arranged in the second direction, and orthographic projections of the second electrode lines on the substrate are disposed between orthographic projections on the substrate of two neighboring rows of the first electrodes that are arranged in the second direction, and the second electrode lines are electrically connected to at least one of the first electrodes that belong to a same one touch-controlling unit;

each of the second electrode lines includes a disconnection point, and the disconnection point of the second electrode line is located at a boundary between two neighboring touch-controlling units that are arranged in the first direction;

each of the second via holes is disposed at the boundary between the two neighboring touch-controlling units that are arranged in the first direction, and exposes the disconnection point of the second electrode line;

the second via holes and the first via holes do not intersect or overlap in a direction perpendicular to a plane where the substrate is located; and each of the second insulating parts is disposed inside one of the second via holes, and fills and levels up the second via hole.

Optionally, the array base plate further includes an alignment layer, and the alignment layer covers the plurality of touch-controlling units; and the alignment layer and the second insulating parts are of an integral structure.

Optionally, the array base plate further includes a substrate and an alignment layer, and the alignment layer is disposed on one side of the touch-controlling units that is away from the substrate, and covers the plurality of touch-controlling units;

each of the second insulating parts includes a third insulating sub-part and a fourth insulating sub-part, the third insulating sub-part is located at one of the disconnection points of the second electrode lines, and the fourth insulating sub-part is disposed on one side of the third insulating sub-part that is away from the substrate; and the alignment layer and the fourth insulating sub-part are of an integral structure.

Optionally, the disconnection points of the plurality of second electrode lines are arranged in the second direction, and the plurality of second via holes are arranged in the second direction.

Optionally, each of the sub-pixels further includes a transistor and a second electrode;

the transistor does not intersect or overlap with the first electrode line, the first electrode and the second electrode line in the direction perpendicular to the plane where the substrate is located;

the transistor includes a grid, a first terminal and a second terminal;

an orthographic projection of the second electrode on the substrate and an orthographic projection of the first electrode on the substrate at least partially intersect or overlap; and the second electrode is electrically connected to the first terminal, and is configured for, at the displaying stage, forming an electric field with the first electrode.

Optionally, the array base plate further includes:

a plurality of grid lines arranged in the first direction, wherein orthographic projections of the grid lines on the substrate are disposed between orthographic projections on the substrate of two neighboring rows of the first electrodes that are arranged in the first direction, and the grid lines are electrically connected to the grid electrodes of the transistors in a same one row; and the grid lines and the first electrode lines do not intersect or overlap in the direction perpendicular to the plane where the substrate is located.

Optionally, the array base plate further includes:

a plurality of data lines arranged in the second direction, wherein orthographic projections of the data lines on the substrate are disposed between orthographic projections on the substrate of two neighboring rows of the first electrodes that are arranged in the second direction, and the data lines are electrically connected to the second terminals of the transistors in a same one row; and the data lines and the second electrode lines do not intersect or overlap in the direction perpendicular to the plane where the substrate is located.

Optionally, the grid lines and the first electrode lines are arranged in a same layer; and the data lines, the first terminals and the second terminals are arranged in a same layer.

Optionally, the transistor is a bottom-grid-type transistor;

the first electrode lines are lap-joined to one side of the first electrodes in a same one row;

the array base plate further includes a grid insulating layer, a first passivation layer and a second passivation layer;

the grid insulating layer covers the grid line, the first electrode line and a part of the first electrode that is not covered by the first electrode line;

the first passivation layer covers the data line and the grid insulating layer;

the second passivation layer covers the second electrode line and the first passivation layer;

the first via hole extends throughout the first electrode line, the grid insulating layer, the first passivation layer and the second passivation layer; and the second via hole extends throughout the second electrode line and the second passivation layer.

Optionally, the sub-pixel further includes a plurality of connecting electrodes, and the connecting electrodes and the second electrodes are arranged in a same layer;

the plurality of first electrode lines are divided into a first group and a second group, wherein the first electrode lines of the first group and the first electrode lines of the second group are arranged alternately in the first direction; and the connecting electrodes are configured for electrically connecting the first electrodes electrically connected to the first electrode lines of the first group to the first electrode lines of the second group neighboring the first group.

In another aspect, there is provided a display panel, wherein the display panel includes the array base plate stated above.

In yet another aspect, there is provided a method for preparing the array base plate, wherein the method includes:

forming the plurality of first electrodes arranged in an array;

forming the plurality of driving electrode lines;

forming a plurality of lines to be detected, wherein the lines to be detected include the grid lines and/or the data lines;

detecting the lines to be detected; and when the lines to be detected are at a normal detected state, forming the plurality of isolating via holes and the plurality of isolating and insulating parts, wherein the isolating via holes are disposed at the boundaries between the two neighboring touch-controlling units that are arranged in the direction of the driving electrode lines, and the driving electrode lines are discontinuous at positions where the isolating via holes are located; and each of the isolating and insulating parts is disposed inside one of the isolating via holes, and fills and levels up the isolating via hole.

Optionally, the step of forming the plurality of driving electrode lines includes: forming the plurality of first electrode lines arranged in the first direction; and the step of, when the lines to be detected are at the normal detected state, forming the plurality of isolating via holes and the plurality of isolating and insulating parts includes:

by using an etching process, removing film layers at the boundaries between two neighboring touch-controlling units that are arranged in the second direction, and exposing parts of the first electrode lines that are required to be broken;

by using wet etching, removing the parts of the first electrode lines that are required to be broken, and forming the first via holes; and by using a one-step patterning process, forming the first insulating parts and the alignment layer.

Optionally, the step of forming the plurality of driving electrode lines includes: forming the plurality of first electrode lines arranged in the first direction; and the step of, when the lines to be detected are at the normal detected state, forming the plurality of isolating via holes and the plurality of isolating and insulating parts includes:

by using an etching process, removing film layers at the boundaries between two neighboring touch-controlling units that are arranged in the second direction, and exposing parts of the first electrode lines that are required to be broken;

by using oxygen-containing-gas etching, removing the parts of the first electrode lines that are required to be broken, and forming the first via holes and the first insulating sub-parts; and by using a one-step patterning process, forming the second insulating sub-parts and the alignment layer.

Optionally, the step of forming the plurality of driving electrode lines further includes: forming the plurality of second electrode lines arranged in the second direction; and the method further includes:

when the first electrode lines are continuous, detecting the second electrode lines; and when the second electrode lines are at a normal detected state, forming the plurality of second via holes and the plurality of second insulating parts, wherein each of the second via holes is disposed at the boundary between the two neighboring touch-controlling units that are arranged in the first direction, and the second electrode lines are discontinuous at positions where the second via holes are located; the second via holes and the first via holes do not intersect or overlap in a direction perpendicular to a plane where the substrate is located; and each of the second insulating parts is disposed inside one of the second via holes, and fills and levels up the second via hole.

Optionally, the step of, when the second electrode lines are at the normal detected state, forming the plurality of second via holes and the plurality of second insulating parts includes:

by using an etching process, removing film layers at the boundaries between two neighboring touch-controlling units that are arranged in the first direction, and exposing parts of the second electrode lines that are required to be broken;

by using wet etching, removing the parts of the second electrode lines that are required to be broken, and forming the second via holes; and by using a one-step patterning process, forming the second insulating parts and the alignment layer; or the step of, when the second electrode lines are at the normal detected state, forming the plurality of second via holes and the plurality of second insulating parts includes:

by using an etching process, removing film layers at the boundaries between two neighboring touch-controlling units that are arranged in the first direction, and exposing parts of the second electrode lines that are required to be broken;

by using oxygen-containing-gas etching, removing the parts of the second electrode lines that are required to be broken, and forming the second via holes and the third insulating sub-parts; and by using a one-step patterning process, forming the fourth insulating sub-parts and the alignment layer.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are merely embodiments of the present application, and a person skilled in the art can obtain other figures according to these figures without paying creative work.

DETAILED DESCRIPTION

Figure 1:
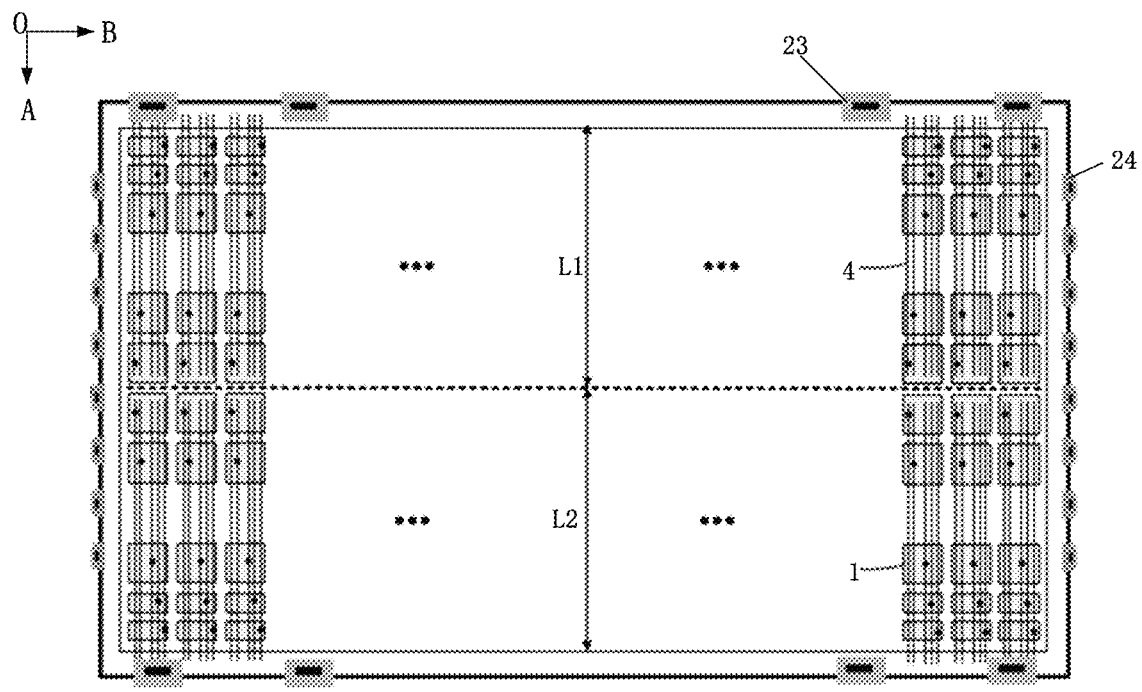
FIG. 1 schematically shows a schematic structural diagram of a display panel.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first", "second", "third" and "fourth" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

In the embodiments of the present application, the meaning of "plurality of" is "two or more", and the meaning of "at least one" is "one or more", unless explicitly and particularly defined otherwise.

In the embodiments of the present application, the terms that indicate orientation or position relations, such as "upper" and "lower", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

Figure 2:
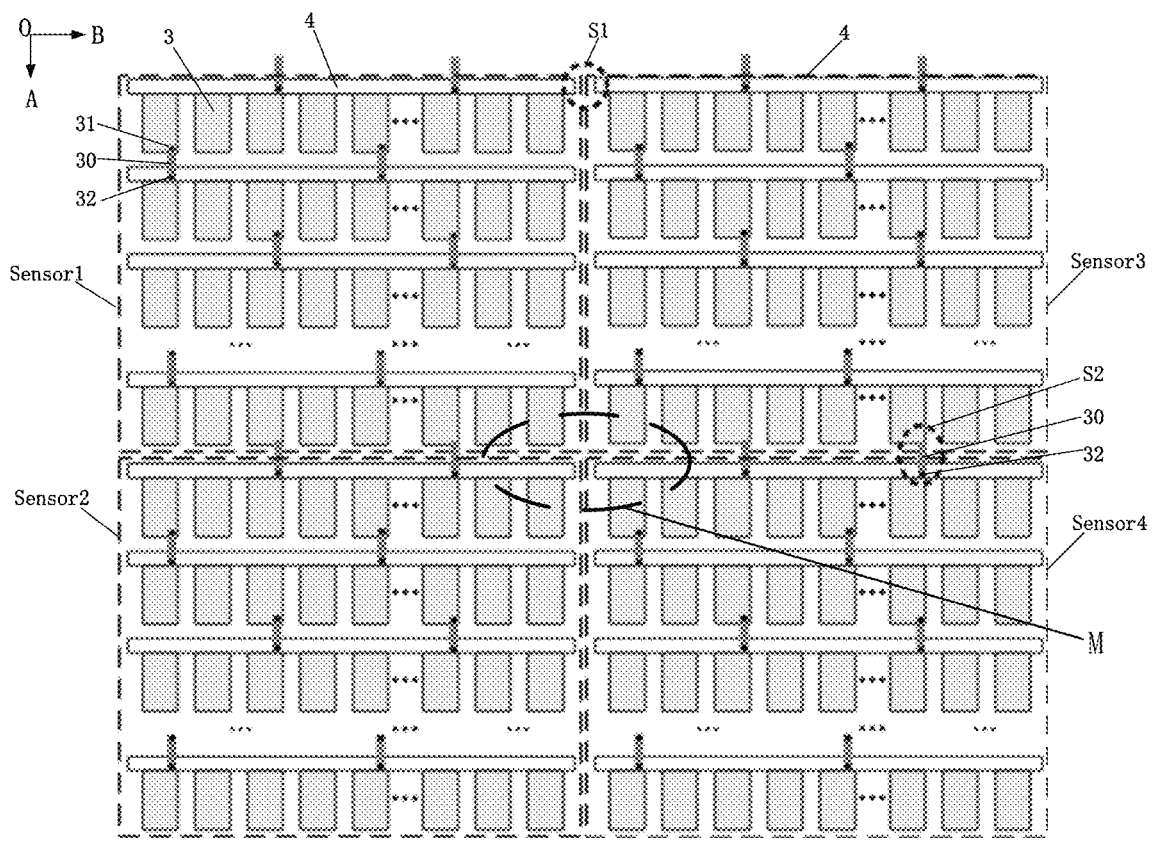
FIG. 2 schematically shows a schematic structural diagram of an array base plate.

An embodiment of the present application provides an array base plate. Referring to FIGS. 1-4, 6 and 7, the array base plate includes:

a substrate 20, wherein the material of the substrate is not limited, and, as an example, may be a rigid material, for example, glass;

a plurality of touch-controlling units 1 shown in FIG. 1 that are disposed on the substrate 20 and are arranged in an array, wherein each of the touch-controlling units includes a plurality of sub-pixels arranged in an array; referring to FIG. 2, each of the sub-pixels includes a first electrode 3; the first electrodes of all of the sub-pixels of the touch-controlling units are electrically connected; and the first electrodes are configured for being used as driving electrodes at a displaying stage, and used as touch-controlling sensing electrodes at a touch-controlling stage;

a plurality of driving electrode lines, wherein at least part of orthographic projections of the driving electrode lines on the substrate are disposed between orthographic projections on the substrate of two neighboring rows of the first electrodes, and the driving electrode lines are electrically connected to at least one of the first electrodes; in the two neighboring rows of the first electrodes, all of the rows of the first electrodes are arranged in a direction of the driving electrode lines; each of the driving electrode lines includes one or more disconnection points, and the disconnection points of the driving electrode lines are located at boundaries between two neighboring touch-controlling units that are arranged in the direction of the driving electrode lines; and the driving electrode lines are configured for transmitting driving signals at the displaying stage, and transmitting touch-controlling signals at the touch-controlling stage;

one or more isolating via holes, wherein the isolating via holes are disposed at the boundaries between the two neighboring touch-controlling units that are arranged in the direction of the driving electrode lines, and expose the disconnection points of the driving electrode lines; and one or more isolating and insulating parts, wherein each of the isolating and insulating parts is disposed inside one of the isolating via holes, and fills and levels up the isolating via hole.

Figure 3:
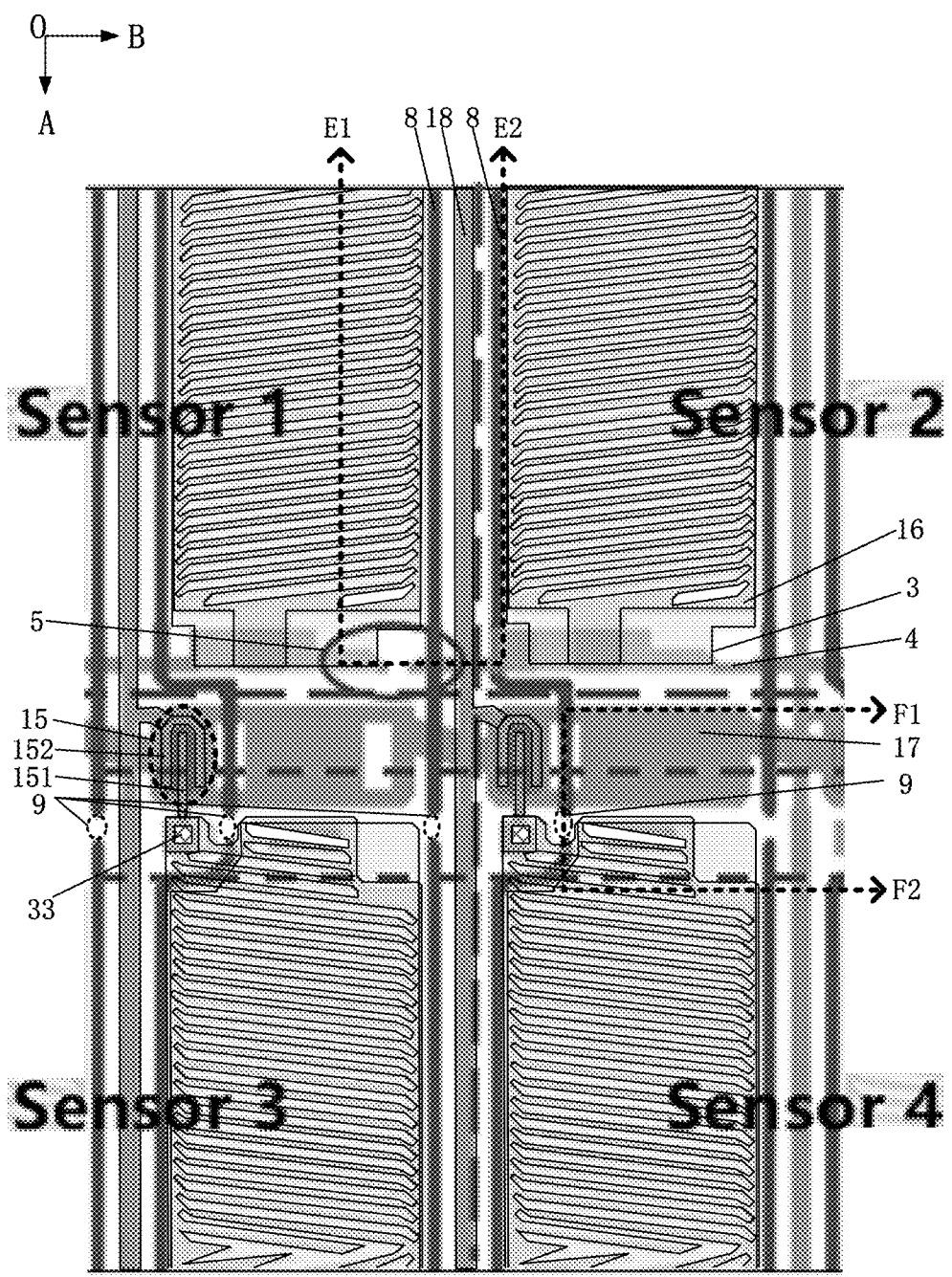
FIG. 3 is a first partially enlarged view of the region M in FIG. 2.
Figure 6:
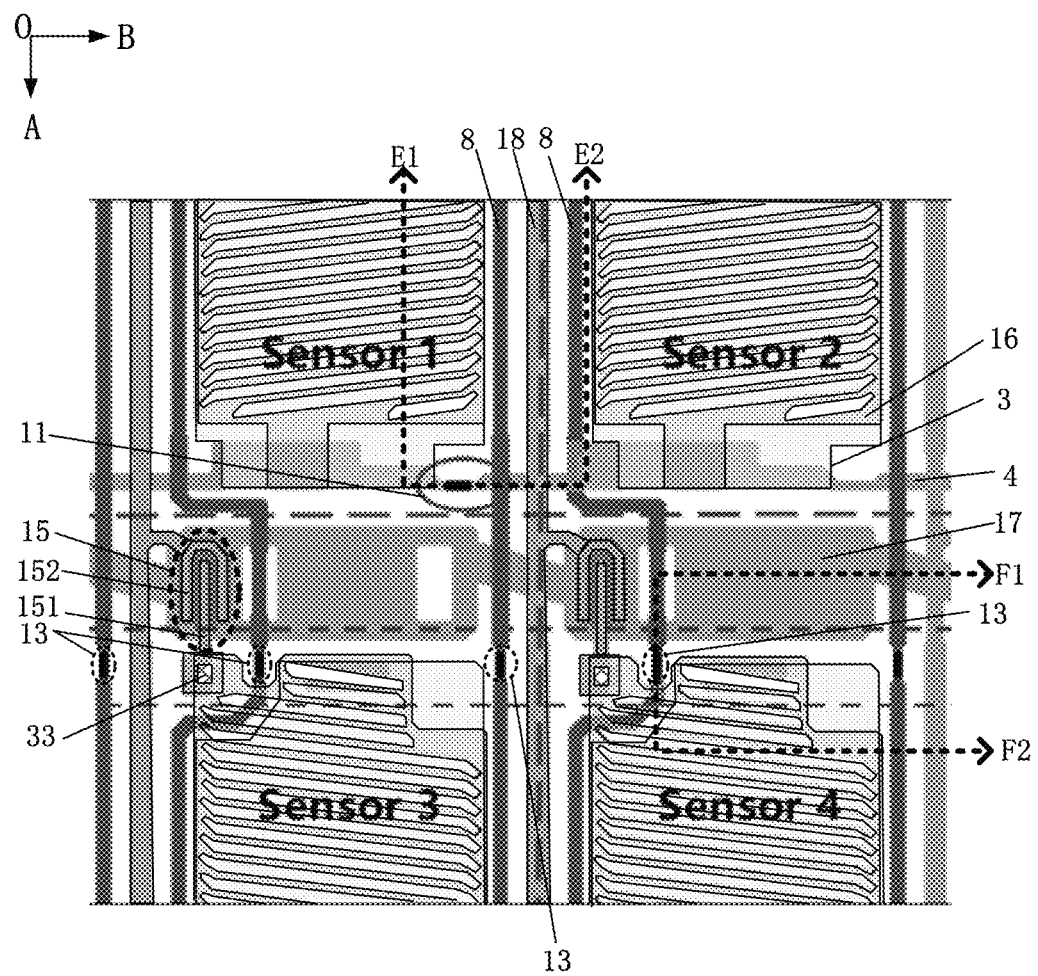
FIG. 6 is a second partially enlarged view of the region M in FIG. 2.

The driving electrode lines may include, as shown in FIGS. 3 and 6, first electrode lines 4 and/or second electrode lines 8.

In the array base plate, in order to reduce the difficulty in realizing the In Cell Touch, time multiplexing may be performed to the first electrodes. In other words, the first electrodes are used as driving electrodes at a displaying stage, to drive the liquid crystal to deflect, and used as touch-controlling sensing electrodes at a touch-controlling stage, to form a touch-controlling capacitor with a finger, to realize the effect of touch controlling.

The array base plate may be applied to ADS (Advanced Super Dimension Switch) type liquid-crystal touch-controlled display screens or HADS-type liquid-crystal touch-controlled display screens, which is not limited herein. As compared with the ADS-type liquid-crystal touch-controlled display screens, in order to further increase the aperture ratio, the HADS-type liquid-crystal touch-controlled display screens emerge correspondingly. The main difference between the ADS type and the HADS type is that the electrode positions of the common electrodes (Com electrode) and the pixel electrodes (Pixel electrode) are different. If the array base plate is applied to an ADS-type touch-controlled display screen, then the first electrode may be referred to as a common electrode, in which case the first electrode line may be referred to as a common-electrode line. If the array base plate is applied to a HADS-type liquid-crystal touch-controlled display screen, then the first electrode may be referred to as a pixel electrode, in which case the first electrode line may be referred to as a pixel-electrode line. Taking the ADS type as an example for the description, in ADS-type array base plates in the related art, the common electrode is generally an integral electrode of the size equal to that of the base plate, while, in the array base plate according to the present application, the first electrodes of the sub-pixels are independently disposed, and the plurality of first electrodes that belong to the same one touch-controlling unit are electrically connected.

The size of the array base plate is not limited. It may be applied to large-sized or super-large-sized (for example, 86 inches) UHD (Ultra High Definition) displaying devices or HD (High Definition) displaying devices. Alternatively, it may also be applied to small-sized (for example, 23.6 inches) UHD displaying devices or HD displaying devices.

The isolating and insulating part enables the parts of the driving electrode line that are located within the regions where two neighboring touch-controlling units are located to maintain insulated. The material of the isolating and insulating part is not limited herein.

The driving electrode lines include the first electrode lines and/or the second electrode lines. Because the first electrode lines and/or the second electrode lines are provided with at least one disconnection point, if the driving electrode lines having the disconnection point are directly formed, that has a high requirement on the precision of the mask, and easily generates static electricity, which reduces the film-formation quality, thereby finally resulting in imperfect. In the present application, continuously provided driving electrode lines may be formed firstly, and subsequently, by disposing the isolating via holes and the isolating and insulating parts, the driving electrode lines are discontinuous at the boundaries between two neighboring touch-controlling units that are arranged in the direction of the driving electrode lines. Accordingly, the driving electrode lines can be formed by using a mask of a low precision, thereby preventing generation of static electricity, and improving the film-formation quality, to improve the product yield. The array base plate according to the present application has a high yield and a low production cost.

Figure 4:
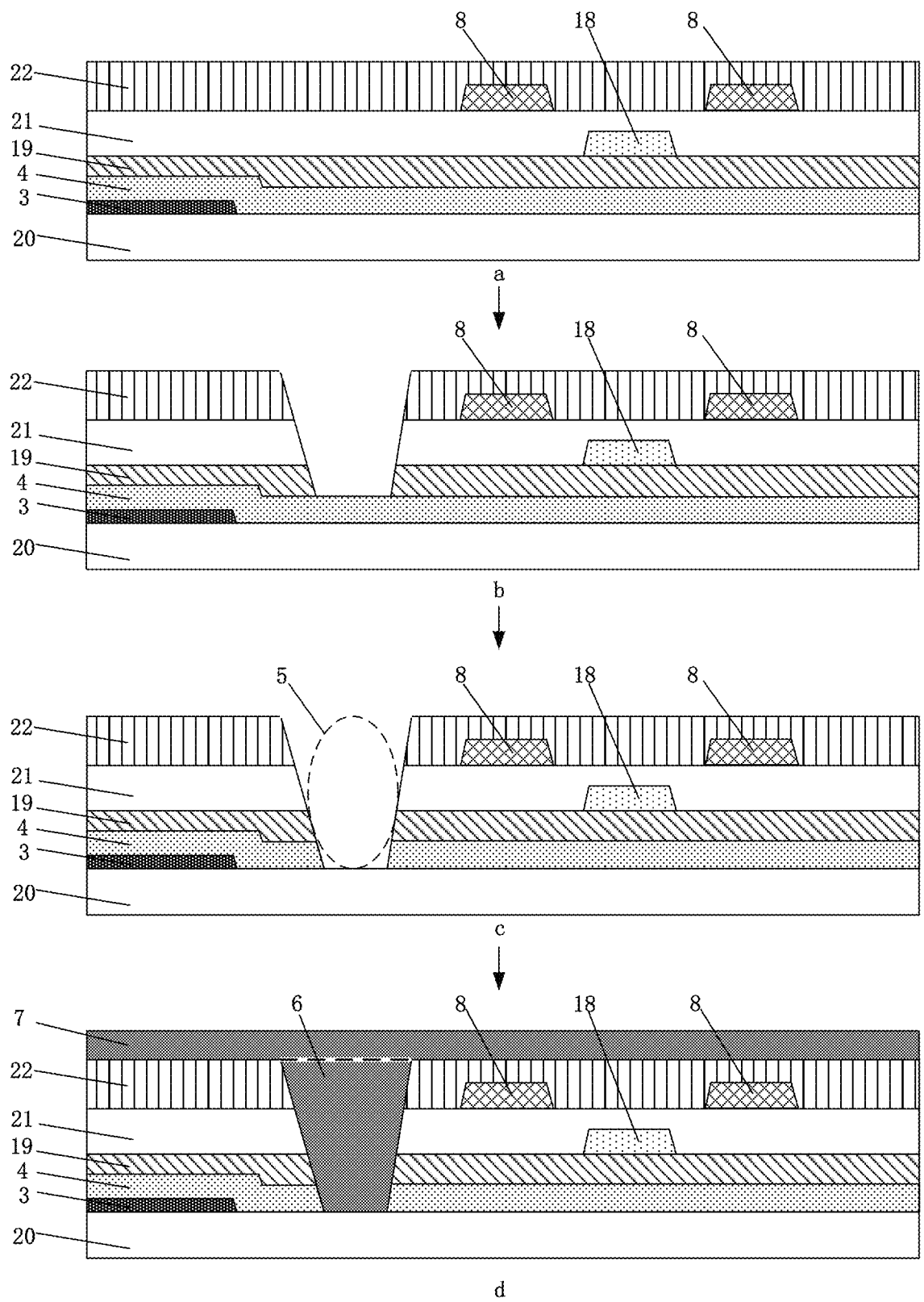
In FIG. 4, FIG. a to FIG. d are a preparation flow chart of the preparation of the array base plate shown in FIG. 3.
Figure 7:
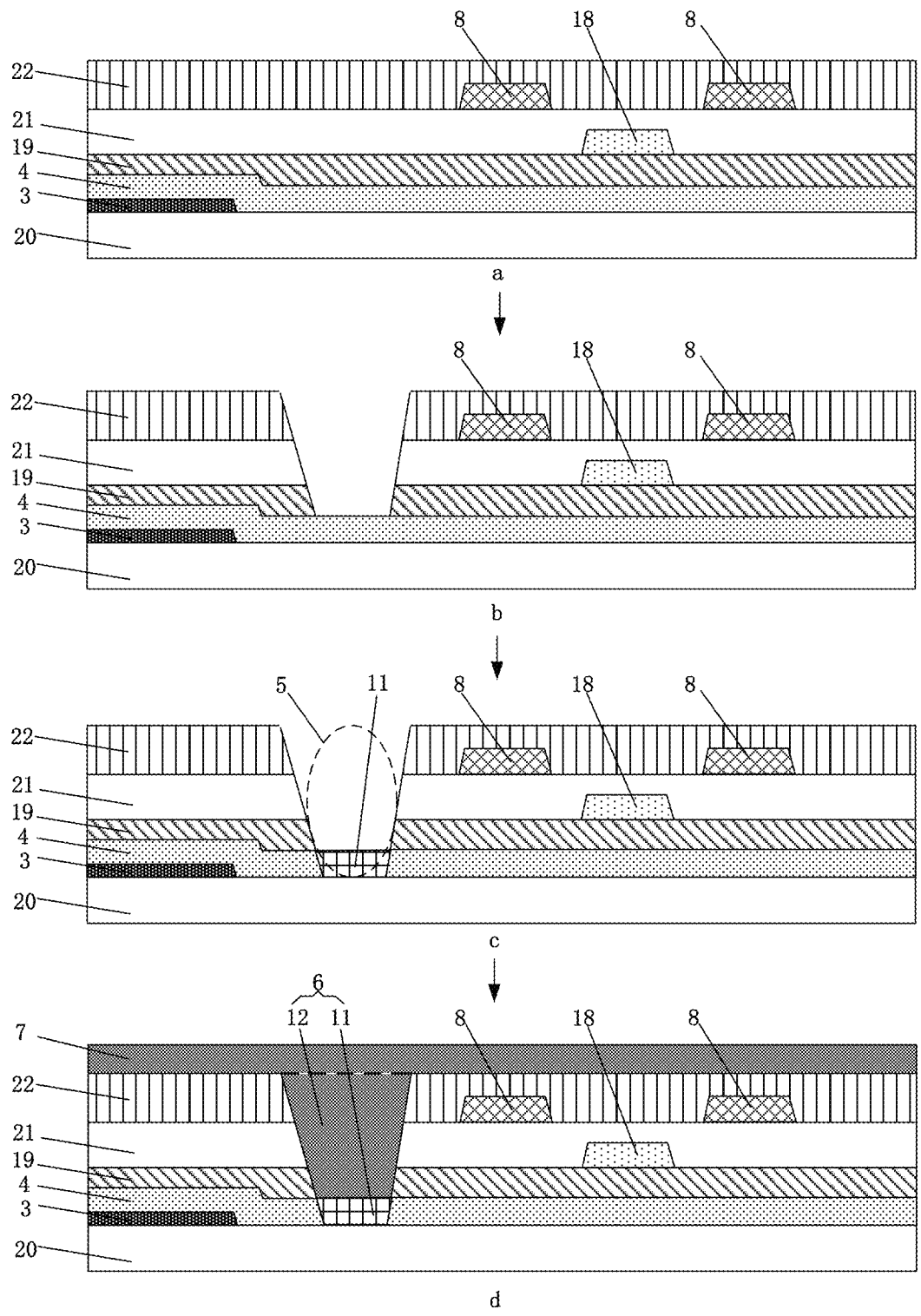
In FIG. 7, FIG. a to FIG. d are a preparation flow chart of the preparation of the array base plate shown in FIG. 6.

In one or more embodiments, the driving electrode lines include first electrode lines; the isolating via holes include first via holes; the isolating and insulating parts include first insulating parts; and referring to FIGS. 1-4, 6 and 7, the array base plate includes:

a substrate 20, wherein the material of the substrate is not limited, and, as an example, may be a rigid material, for example, glass;

a plurality of touch-controlling units 1 shown in FIG. 1 that are disposed on the substrate 20) and are arranged in an array, wherein each of the touch-controlling units includes a plurality of sub-pixels arranged in an array; referring to FIG. 2, each of the sub-pixels includes a first electrode 3; the first electrodes of all of the sub-pixels of the touch-controlling units are electrically connected; and the first electrodes are configured for being used as driving electrodes at a displaying stage, and used as touch-controlling sensing electrodes at a touch-controlling stage;

a plurality of the first electrode lines 4 arranged in the first direction (the direction OA shown in FIG. 2), wherein referring to FIG. 2, the first electrode lines 4 are parallel to a row of the first electrodes 3 that are arranged in a second direction (the direction OB shown in FIG. 2), and at least part of the orthographic projections of the first electrode lines 4 on the substrate are disposed between the orthographic projections on the substrate of two neighboring rows of the first electrodes 3 that are arranged in the first direction (the direction OA shown in FIG. 2), and the first electrode lines 4 are electrically connected to the same one row of the first electrodes 3; each of the first electrode lines includes a plurality of the disconnection points, and the disconnection points of the first electrode lines are located at the boundaries between any two neighboring touch-controlling units that are arranged in the second direction; in other words, the first electrode lines 4 are discontinuous at the boundaries (marked as S1 in FIG. 2) between any two neighboring touch-controlling units that are arranged in the second direction (the direction OB shown in FIG. 2); the second direction intersects with the first direction; and the first electrode lines are configured for transmitting driving signals at the displaying stage, and transmitting touch-controlling signals at the touch-controlling stage;

a plurality of first via holes 5 shown in FIG. c in FIG. 4 and FIG. c in FIG. 7, wherein referring to FIG. c in FIG. 3 and FIG. 4 or referring to FIG. c in FIG. 6 and FIG. 7, the first via holes 5 are disposed at the boundaries between the two neighboring touch-controlling units that are arranged in the second direction (the direction OB shown in FIG. 3), and expose the disconnection points of the first electrode lines 4, wherein FIG. c in FIG. 4 is a schematic cross-sectional view along E1E2 in FIG. 3, and FIG. c in FIG. 7 is a schematic cross-sectional view along E1E2 in FIG. 6; and a plurality of first insulating parts 6 shown in FIG. d in FIG. 4 and FIG. d in FIG. 7, wherein each of the first insulating parts 6 is disposed inside one of the first via holes 5, and fills and levels up the first via hole 5.

It should be noted that the sizes of the plurality of touch-controlling units 1 arranged in the first direction (the direction OA shown in FIG. 1) may be equal, and may also be unequal, which is not limited herein. In order to facilitate the wiring, the sizes of the plurality of touch-controlling units arranged in the second direction (the direction OB shown in FIG. 1) are equal. FIG. 1 illustrates by taking the case as an example in which, when arranged in the first direction, the sizes of the touch-controlling units located at the middle positions and the sizes of the touch-controlling units located at the upper-side and lower-side positions are unequal. The particular quantity of the sub-pixels included in the touch-controlling units is not limited, and may be selected according to actual situations.

The first electrode lines are electrically connected to the same one row of the first electrodes. The particular implementation of the electric connection is not limited herein. As an example, referring to FIG. 3 and FIG. d in FIG. 4, the first electrode lines 4 and the same one row of the first electrodes 3 may realize the electric connection by direct contacting. Alternatively, the first electrode lines 4 and the same one row of the first electrodes may realize the electric connection by using a plurality of connecting units. That may be particularly determined according to design structures.

Referring to FIG. 2, the first electrode lines 4 are discontinuous at the boundaries (marked as S1 in FIG. 2) between any two neighboring touch-controlling units that are arranged in the second direction (the direction OB shown in FIG. 2). In other words, each of the first electrode lines is overall of a discontinuous configuration, but the parts of it that are located within the regions where the touch-controlling units are located are continuous. FIG. 2 illustrates by taking the case as an example in which there are four touch-controlling units Sensor1, Sensor2, Sensor3 and Sensor4.

The first electrode may be configured to be a strip-shaped electrode. The first direction may be the direction OA shown in FIG. 2 (i.e., the direction of the longer sides of the first electrode), in which case the second direction may be the direction OB shown in FIG. 2 (i.e., the direction of the shorter sides of the first electrode). Alternatively, the first direction may also be the direction OB shown in FIG. 2 (i.e., the direction of the shorter sides of the first electrode), in which case the second direction may be the direction OA shown in FIG. 2 (i.e., the direction of the longer sides of the first electrode). That is not limited herein. All of FIGS. 1-3 illustrate by taking the case as an example in which the first direction is the direction OA and the second direction is the direction OB.

The first via holes correspond to the disconnection points of the first electrode lines. The film layers that the first via hole extends throughout are not limited herein, and are required to be particularly determined according to design structures. As an example, referring to FIG. c in FIG. 4, the first via hole 5 may extend throughout a second passivation layer 22, a first passivation layer 21, a grid insulating layer (GI layer) 19 and the first electrode line 4, thereby exposing the disconnection point of the first electrode line.

The first insulating part enables the parts of the first electrode line that are located within the regions where two neighboring touch-controlling units are located to maintain insulated. The material of the first insulating part is not limited herein. FIG. d in FIG. 4 and FIG. d in FIG. 7 individually illustrate a structural diagram of the first insulating part.

Figure 9:
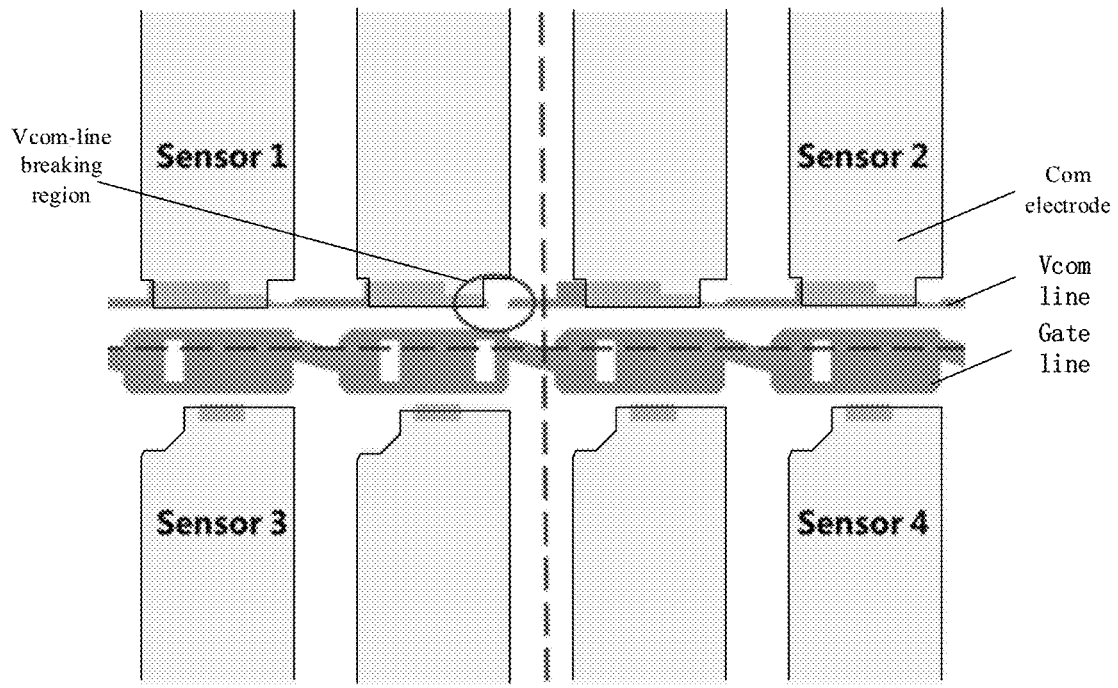
FIG. 9 is a third partially enlarged view of the region M in FIG. 2.
Figure 11:
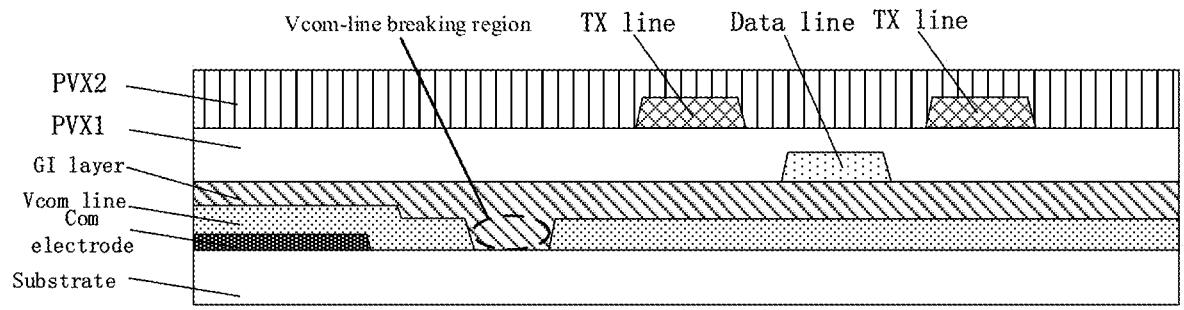
FIG. 11 is a schematic cross-sectional view along E1E2 in FIG. 10.

In order to ensure realizing the function of touch controlling, the first electrode lines are discontinuous at the boundaries between any two neighboring touch-controlling units that are arranged in the second direction. In the related art, referring to FIGS. 9 and 11, the fabricated Vcom line is discontinuous. Accordingly, in the detection of the array base plate including such a structure, the first electrode lines cannot normally load the testing signals, and therefore the relevant traces (for example, the grid lines, the data lines and so on) cannot be detected, which results in that the imperfects such as GCS (the imperfect caused by short circuiting of the grid lines and the electrodes). DCS (the imperfect caused by short circuiting of the data lines and the electrodes). TCS (the imperfect caused by short circuiting of the touch controlling lines and the electrodes). TTS (the imperfect caused by short circuiting of the touch controlling lines and the touch controlling lines). TOP (the imperfect caused by open circuiting of the touch controlling lines and the electrodes) and TGS (the imperfect caused by short circuiting of the touch controlling lines and the grid lines) cannot be checked out. Therefore, the imperfects cannot be repaired, which reduces the product yield and causes a large amount of waste of the materials, the energy and the manpower, thereby highly increasing the production cost.

Figure 13:
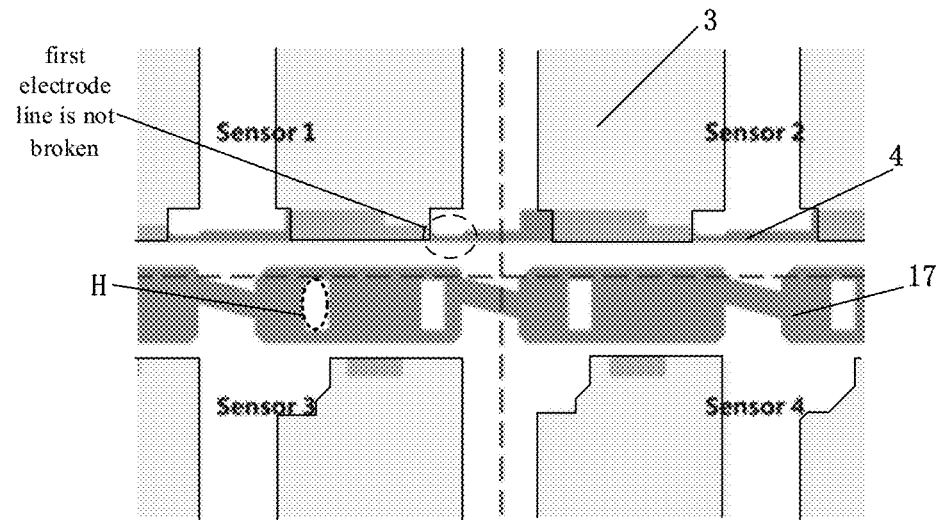
FIG. 13 is a fifth partially enlarged view of the region M in FIG. 2.

The process of preparing the array base plate according to the present application may include, as shown in FIG. 13, firstly forming a continuous first electrode line 4, and after the detection and the repairing of the relevant traces (for example, the grid lines, the data lines, the touch controlling lines and so on) are completed, providing a plurality of first via holes and a plurality of first insulating parts, so that the first electrode line is discontinuous at the boundaries between any two neighboring touch-controlling units that are arranged in the second direction. In an aspect, the checkout and the repairing of the imperfects can be ensured, and, in another aspect, the realizing of the function of touch controlling can be ensured. The array base plate according to the present application has a high yield and a low production cost.

The particular structure of the first insulating part will be described below.

The present application provides a particular structure of the first insulating part. In order to reduce the fabrication difficulty and simplify the structure, referring to FIG. d in FIG. 4, the array base plate further includes an alignment layer 7, and the alignment layer covers the plurality of touch-controlling units; and the alignment layer 7 and the first insulating parts 6 are of an integral structure. It should be noted that a liquid-crystal display panel may include an array base plate, a color-film base plate, and a liquid-crystal layer disposed between the array base plate and the color-film base plate. When the above-described array base plate is applied to a liquid-crystal display panel, because the liquid crystal has fluidity, in order to ensure that the initial orientations of the liquid-crystal molecules are the same, alignment layers are disposed on the two sides of the liquid-crystal layer. Therefore, the array base plate may further include an alignment layer.

The materials of the alignment layer and the first insulating parts are not limited. As an example, both of them may include PI (polyimide). In such a structure, the material of the first insulating parts and the material of the alignment layer are the same. Certainly, the first insulating parts and the alignment layer may also use different materials, and be fabricated separately. Considering the simplification of the fabrication process, the alignment layer and the first insulating parts may be configured to be of an integral structure, in which case they use the same material.

The present application provides another particular structure of the first insulating part. In order to reduce the fabrication difficulty and simplify the structure, referring to FIG. d in FIG. 7, the array base plate further includes an alignment layer 7, and the alignment layer is disposed on one side of the touch-controlling units that is away from the substrate, and covers the plurality of touch-controlling units.

Referring to FIG. d in FIG. 7, each of the first insulating parts 6 includes a first insulating sub-part 11 and a second insulating sub-part 12, the first insulating sub-part 11 is located at one of the disconnection points of the first electrode lines 4, and the second insulating sub-part 12 is disposed on the side of the first insulating sub-part 11 that is away from the substrate 20; and the alignment layer 7 and the second insulating sub-part 12 are of an integral structure.

The materials of the alignment layer and the first insulating sub-part are not limited. As an example, both of them may include PI (polyimide). The material of the second insulating sub-part is not limited. As an example, the material of the second insulating sub-part includes a metal oxidized chelate, for example, a copper oxidized chelate. The copper oxidized chelate has the characteristics of a high impedance and no electric conductivity. In such a structure, the material of the first insulating sub-part and the material of the alignment layer are the same, and the material of the second insulating sub-part and the material of the first insulating sub-part are different.

Certainly, the first insulating sub-part and the alignment layer may also use different materials, and be fabricated separately. Considering the simplification of the preparation process, the alignment layer and the first insulating sub-part may be configured to be of an integral structure, in which case they use the same material.

Figure 5:
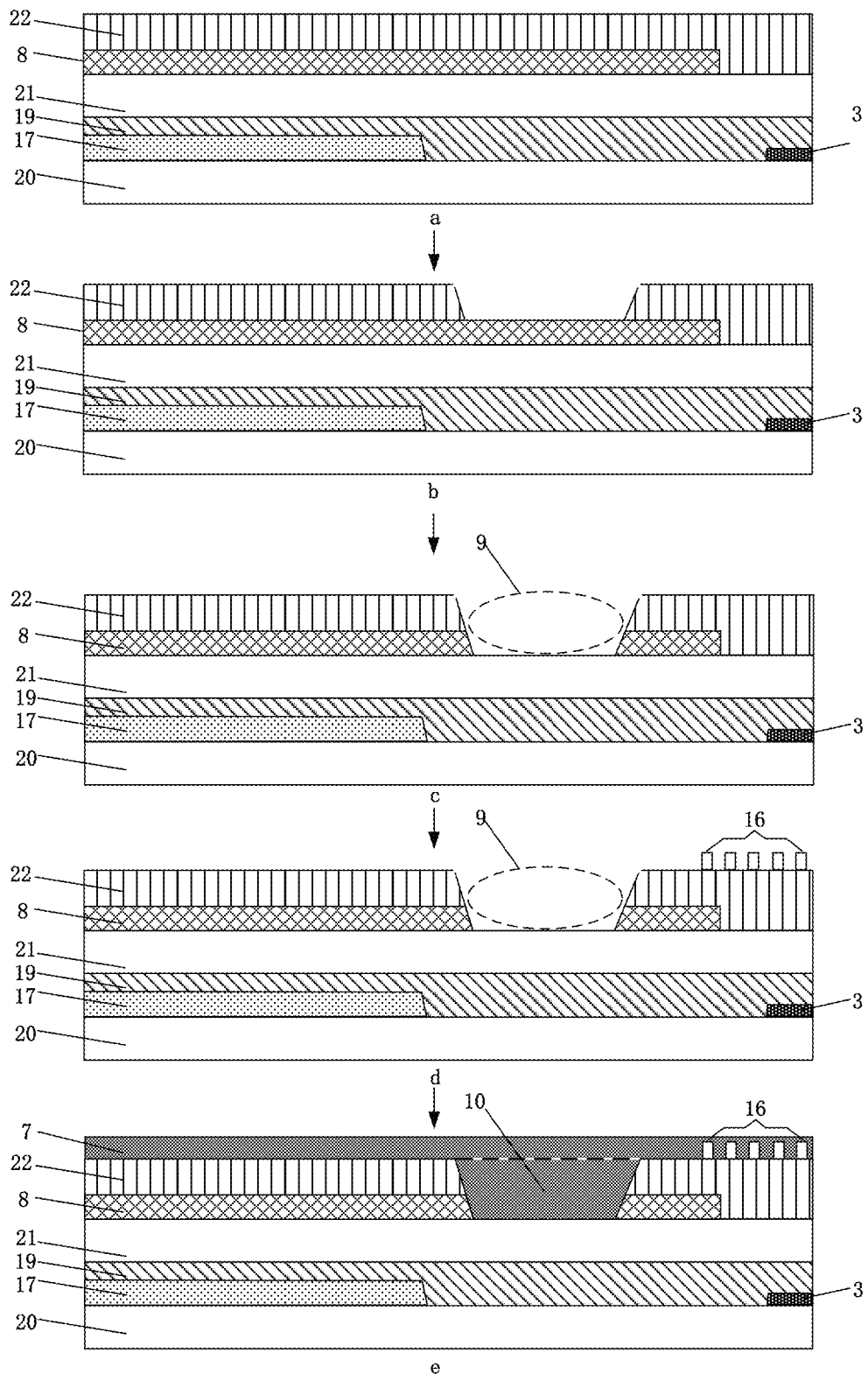
In FIG. 5, FIG. a to FIG. e are another preparation flow chart of the preparation of the array base plate shown in FIG. 3.
Figure 8:
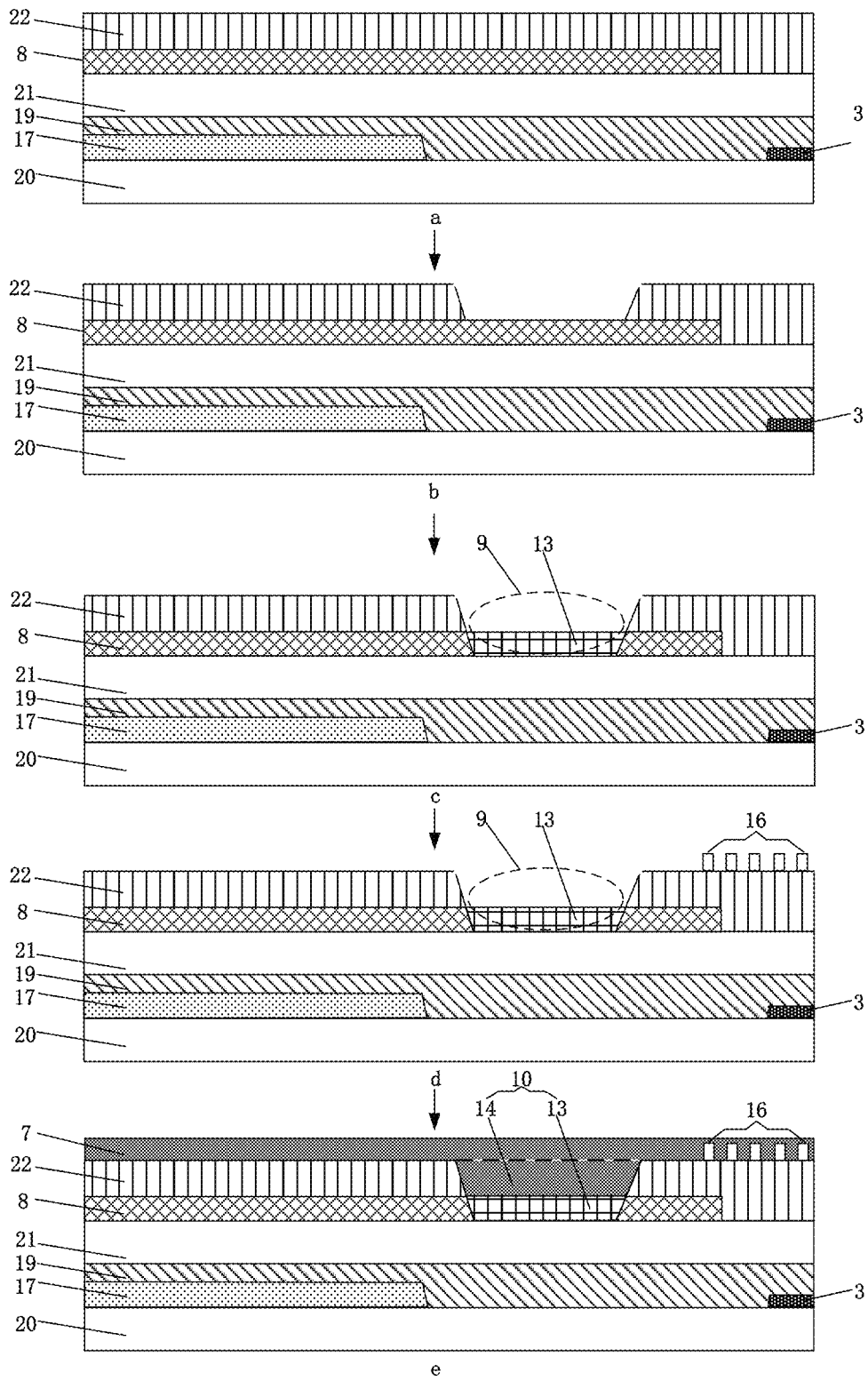
In FIG. 8, FIG. a to FIG. e are another preparation flow chart of the preparation of the array base plate shown in FIG. 6.

In one or more embodiments, the driving electrode lines include second electrode lines; the isolating via holes include second via holes; the isolating and insulating parts include second insulating parts; and the array base plate further includes:

a plurality of second electrode lines 4 shown in FIG. 1 that are arranged in the second direction (the direction OB shown in FIG. 1), wherein referring to FIGS. 3 and 6, the orthographic projections of the second electrode lines 8 on the substrate are disposed between the orthographic projections on the substrate of two neighboring rows of the first electrodes 3 that are arranged in the second direction (the direction OB), and the second electrode lines 8 are electrically connected to at least one of the first electrodes 3 that belong to the same one touch-controlling unit;each of the second electrode lines includes a disconnection point, and the disconnection point of the second electrode line is located at a boundary between two neighboring touch-controlling units that are arranged in the first direction; in other words, the second electrode line 8 is discontinuous at the boundary (the position where the second via hole 9 shown in FIG. 3 is located or the position where the third insulating sub-part 13 shown in FIG. 6 is located) between two neighboring touch-controlling units that are arranged in the first direction (the direction OA); and the second electrode lines are configured for transmitting driving signals at the displaying stage, and transmitting touch-controlling signals at the touch-controlling stage;

a plurality of second via holes 9 shown in FIG. d in FIG. 5 and FIG. d in FIG. 8, wherein referring to FIG. d in FIG. 3 and FIG. 5 or referring to FIG. d in FIG. 6 and FIG. 8, each of the second via holes 9 is disposed at the boundary between the two neighboring touch-controlling units that are arranged in the first direction (the direction OA), and exposes the disconnection point of the second electrode line 8; and the second via holes and the first via holes do not intersect or overlap in the direction perpendicular to the plane where the substrate is located; and a plurality of second insulating parts 10 shown in FIG. e in FIG. 5 and FIG. e in FIG. 8, wherein each of the second insulating parts is disposed inside one of the second via holes 9, and fills and levels up the second via hole 9.

In order to satisfy the function of touch controlling, referring to FIG. 1, the plurality of second electrode lines 4 and the plurality of touch-controlling units 1 are electrically connected correspondingly one to one. When the array base plate is applied to a liquid-crystal touch-controlled display screen, the plurality of touch-controlling units are equivalent to a plurality of touch-controlling sensing-electrode blocks (Touch Sensor). Referring to FIG. 1, each of the touch-controlling units 1 may be electrically connected to first driving chips 23 via the second electrode lines 4. The first driving chips may include a TDDI COF (touch-controlled displaying driving chip). The TDDI COF can provide data (Data) signals to the second electrode lines at the displaying stage, receive touch controlling (Touch) signals transmitted by the second electrode lines at the touch-controlling stage, in turn locate by using a Touch MCU (touch controlling microprocessor) the coordinate where the touch controlling happens, and perform the corresponding processing action according to the touch-controlling instruction sent by the user.

The particular quantity of the first electrodes electrically connected to the second electrode lines is not limited. In order to improve the reliability and at the same time simplify the design, the second electrode lines may be electrically connected to two first electrodes that belong to the same one touch-controlling unit. In addition, the particular implementation of the electric connection between the second electrode lines and the first electrodes is not limited herein. As an example, the second electrode lines and the first electrodes may realize the electric connection by using connecting electrodes, which may be particularly determined according to design structures.

The second electrode lines are discontinuous at the boundaries between two neighboring touch-controlling units that are arranged in the first direction. In other words, each of the second electrode lines is overall of a discontinuous configuration, but the parts of it that are located within the regions where the touch-controlling units are located are continuous. The quantity of the second electrode lines between the two neighboring rows of the first electrodes that are arranged in the second direction is not limited, and may be particularly determined according to the quantity of the touch-controlling units. FIGS. 3 and 6 illustrate by taking the case as an example in which two second electrode lines are disposed between two neighboring rows of the first electrodes that are arranged in the second direction.

In order to take into consideration both of the performance of touch controlling and the cost, the second electrode line may be provided with a disconnection point. Moreover, in order to facilitate the split-screen driving, the disconnection points of a plurality of the second electrode lines are arranged in the second direction, and the disconnection points are located at the middle positions of the array base plate (i.e., to delimit the base plate into two regions L1 and L2 shown in FIG. 1), thereby realizing the upper-lower split-screen controlling in the first direction (i.e., the direction OA) shown in FIG. 1.

The second via holes correspond to the disconnection points of the second electrode lines. The film layers that the second via hole extends throughout are not limited herein, and are required to be particularly determined according to design structures. As an example, referring to FIG. 5, the second via hole 9 may extend throughout the second passivation layer 22 and the second electrode line 8, thereby exposing the disconnection point of the second electrode line 8.

The second insulating part enables the parts of the second electrode line that are located within the regions where two neighboring touch-controlling units are located to maintain insulated. The material of the second insulating part is not limited herein. FIG. e in FIG. 5 and FIG. e in FIG. 8 individually illustrate a structure of the second insulating part.

Figure 10:
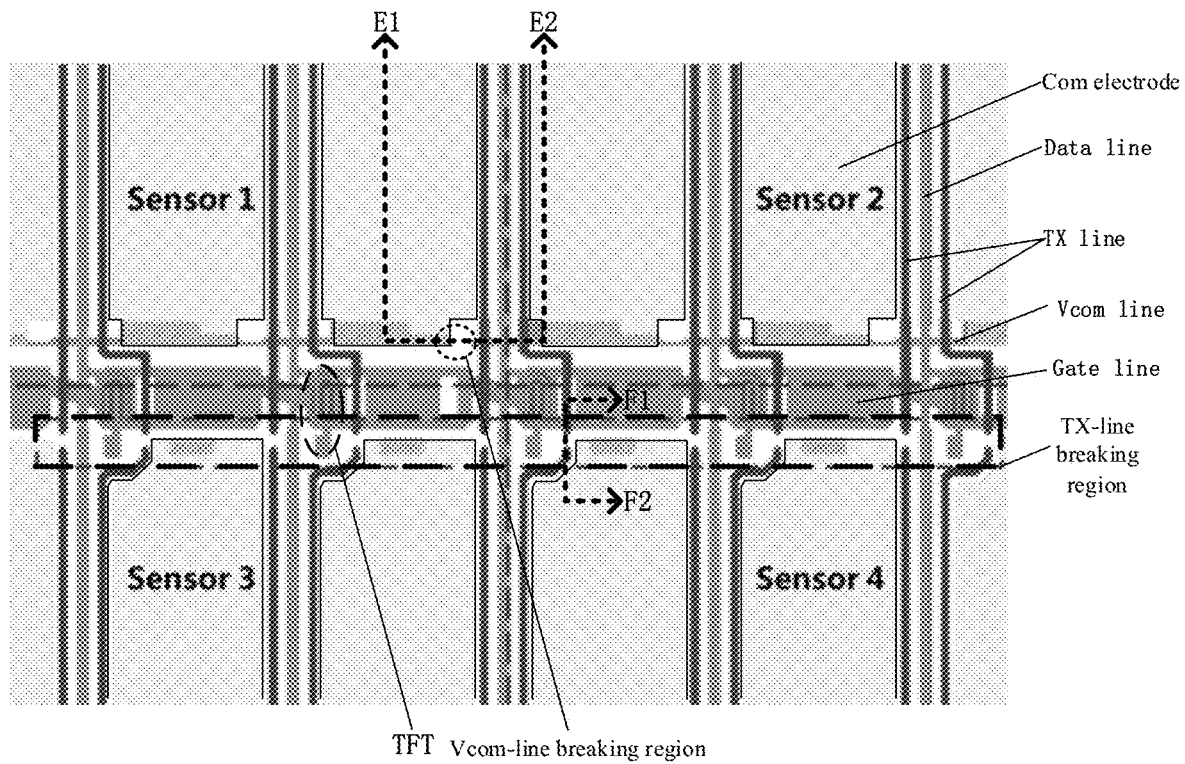
FIG. 10 is a fourth partially enlarged view of the region M in FIG. 2.
Figure 12:
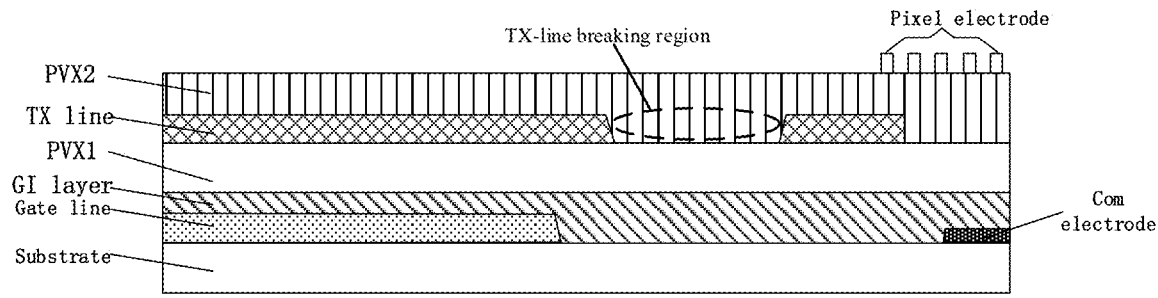
FIG. 12 is a schematic cross-sectional view along F1F2 in FIG. 10.

The second electrode lines transmit touch-controlling signals at the touch-controlling stage. Therefore, the second electrode line may also be referred to as a touch controlling line (Touch Line), referred to for short as a TX line. In large-sized liquid-crystal touch-controlled screens, in order to realize timely response to the touch controlling, the technique of split-screen controlling is usually employed, which requires that the second electrode lines are discontinuous at the boundaries between two neighboring touch-controlling units that are arranged in the first direction. In the related art, referring to FIGS. 10 and 12, the fabricated TX line is discontinuous. Accordingly, in the detection of the array base plate including such a structure, the loading and checkout of the testing signals of the second electrode lines is problematic. Therefore, cases emerge in which an abnormal sub-pixel is checked out but the detecting signal feeds back that the touch-controlling unit that the abnormal sub-pixel belongs to is abnormal, whereby the imperfect is difficult to accurately locate. Therefore, the imperfects cannot be repaired, thereby further reducing the product yield and increasing the production cost.

Figure 14:
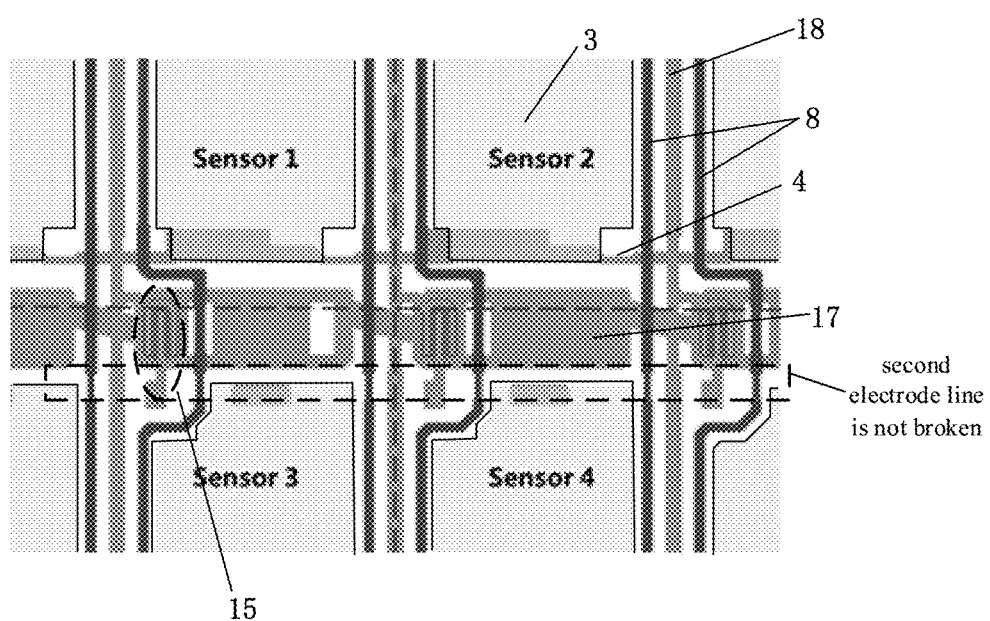
FIG. 14 is a sixth partially enlarged view of the region M in FIG. 2.

The process of preparing the array base plate according to the present application may include, as shown in FIGS. 13 and 14, firstly forming continuous first electrode line 4 and second electrode line 8, and after the detection and the repairing of the second electrode line are completed, disposing a plurality of first via holes, a plurality of second via holes, a plurality of first insulating parts and a plurality of second insulating parts, so that the first electrode line is discontinuous at the boundaries between any two neighboring touch-controlling units that are arranged in the second direction, and the second electrode line is discontinuous at the boundaries between two neighboring touch-controlling units that are arranged in the first direction. In an aspect, the checkout and the accurately located repairing of the imperfects can be ensured, and, in another aspect, the realizing of the function of touch controlling and the split-screen controlling can be ensured. The array base plate according to the present application has a high speed of the response to the touch controlling, a high yield and a low production cost.

The particular structure of the second insulating part will be described below.

The present application provides a structure of the second insulating part. In order to reduce the fabrication difficulty and simplify the structure, referring to FIG. e in FIG. 5, the array base plate further includes an alignment layer 7, and the alignment layer covers the plurality of touch-controlling units; and the alignment layer 7 and the second insulating parts 10 are of an integral structure.

The materials of the alignment layer and the second insulating parts are not limited. As an example, both of them may include PI (polyimide). In such a structure, the material of the second insulating parts and the material of the alignment layer are the same.

It should be noted that the first insulating parts and the alignment layer are of an integral structure, and the alignment layer and the second insulating parts are of an integral structure; in other words, the first insulating parts, the second insulating parts and the alignment layer are of an integral structure. Certainly, the second insulating parts and the alignment layer may also use different materials, and be fabricated separately. Considering the simplification of the fabrication process, the alignment layer and the second insulating parts may be configured to be of an integral structure, in which case they use the same material.

The present application provides another structure of the second insulating part. In order to reduce the fabrication difficulty and simplify the structure, referring to FIG. e in FIG. 5, the array base plate further includes an alignment layer 7, and the alignment layer is disposed on one side of the touch-controlling units that is away from the substrate, and covers the plurality of touch-controlling units.

Referring to FIG. e in FIG. 5, each of the second insulating parts 10 includes a third insulating sub-part 13 and a fourth insulating sub-part 14, the third insulating sub-part 13 is located at one of the disconnection points of the second electrode lines 8, and the fourth insulating sub-part 14 is disposed on the side of the third insulating sub-part 13 that is away from the substrate 20; and the alignment layer 7 and the fourth insulating sub-part 22 are of an integral structure.

The materials of the alignment layer and the fourth insulating sub-part are not limited. As an example, both of them may include PI (polyimide). The material of the third insulating sub-part is not limited. As an example, the material of the third insulating sub-part includes a metal oxidized chelate, for example, a copper oxidized chelate. The copper oxidized chelate has the characteristics of a high impedance and no electric conductivity. In such a structure, the material of the fourth insulating sub-part and the material of the alignment layer are the same, and the material of the third insulating sub-part and the material of the fourth insulating sub-part are different.

Certainly, the fourth insulating sub-part and the alignment layer may also use different materials, and be fabricated separately. Considering the simplification of the fabrication process, the alignment layer and the fourth insulating sub-part may be configured to be of an integral structure, in which case they use the same material.

It should be noted that the second insulating sub-part and the alignment layer are of an integral structure, and the alignment layer and the fourth insulating sub-part are of an integral structure; in other words, the second insulating sub-part, the fourth insulating sub-part and the alignment layer are of an integral structure. The materials of the third insulating sub-part and the first insulating sub-part may be the same, and may also be different, which is not limited herein. In order to reduce the difficulty in fabrication, the former is selected.

In one or more embodiments, in order to take into consideration both of the performance of touch controlling and the cost, the second electrode line is provided with a disconnection point. Moreover, in order to facilitate the split-screen driving, the disconnection points of a plurality of the second electrode lines are arranged in the second direction, and the plurality of second via holes are arranged in the second direction.

The disconnection points of the second electrode lines may be located at the middle positions of the array base plate (i.e., to delimit the base plate into two regions L1 and L2 shown in FIG. 1), thereby realizing the upper-lower split-screen controlling in the first direction (i.e., the direction OA) shown in FIG. 1. Certainly, the disconnection points of the second electrode lines may also be located at other positions of the array base plate, which is not limited herein.

In one or more embodiments, referring to FIGS. 3 and 6, each of the sub-pixels further includes a transistor 15 and a second electrode 16; the transistor 15 does not intersect or overlap with the first electrode line 4, the first electrode 3 and the second electrode line 8 in the direction perpendicular to the plane where the substrate is located; and the transistor includes a grid electrode, a first terminal and a second terminal.

The orthographic projection of the second electrode 16 on the substrate and the orthographic projection of the first electrode 3 on the substrate at least partially intersect or overlap; and the second electrode 16 is electrically connected to the first terminal 151, and is configured for, at the displaying stage, forming an electric field with the first electrode.

The transistor includes a grid electrode, a source electrode and a drain electrode, wherein one of the source electrode and the drain electrode is referred to as the first terminal, and the other is referred to as the second terminal. The transistor may be a P-type thin-film transistor or an N-type thin-film transistor, which is not limited herein. Certainly, the transistor may further include an active layer. The material of the active layer may be monocrystalline silicon; or amorphous silicon; or polycrystalline silicon, for example, LTPS (Low Temperature Poly-silicon); or an oxide semiconductor material, for example, IGZO (Indium Gallium Zinc Oxide), ITZO (Indium Tin Zinc Oxide), IZO (Indium Zinc Oxide) and so on.

According to the position relation of the electrodes, transistors may be classified into two types. In one of the types, the grid electrode is located under the source electrode and the drain electrode, and this type is referred to as bottom-grid-type transistors. In the other type, the grid is located over the source electrode and the drain electrode, and this type is referred to as top-grid-type transistors. The transistor according to the present application may be of the bottom-grid type or the top-grid type. When the array base plate is applied to a liquid-crystal touch-controlled screen, because the liquid crystal itself does not emit light, the liquid-crystal touch-controlled screen further includes a backlight module. The light rays emitted by the backlight module pass through the array base plate and enter the liquid crystal. By regulating the deflection angle of the liquid crystal, to in turn control the quantity of the emergent light rays, finally the displaying of different frames is realized. Because the active layer of the transistor is easily influenced by the light rays, if a bottom-grid-type transistor is used, the grid can block the light rays entering the active layer, which protects the active layer to a certain extent, thereby improving the performance of the transistor. FIGS. 3 and 6 illustrate by taking a bottom-grid-type transistor as an example.

If the array base plate is applied to an ADS-type touch-controlled display screen, then the first electrode may be referred to as a common electrode, and the second electrode may be referred to as a pixel electrode. If the array base plate is applied to a HADS-type liquid-crystal touch-controlled display screen, then the first electrode may be referred to as a pixel electrode, and the second electrode may be referred to as a common electrode.

The array base plate, at the displaying stage, can control the voltage of the second electrode by using the transistor, thereby controlling the magnitude of the electric field between the first electrode and the second electrode. When the array base plate is applied to a liquid-crystal touch-controlled display screen, the electric field generated by the first electrode and the second electrode can cause the liquid crystal to deflect. By changing the magnitude of the electric field, to in turn change the deflection angle of the liquid crystal, to control the quantity of the emergent light rays, finally the displaying of different frames is realized.

Optionally, referring to FIGS. 3 and 6, the array base plate further includes: a plurality of grid lines 17 arranged in the first direction (the direction OA), wherein the orthographic projections of the grid lines 17 on the substrate are disposed between the orthographic projections on the substrate of two neighboring rows of the first electrodes 3 that are arranged in the first direction, and the grid lines are electrically connected to the grid electrodes of the transistors in a same one row; and the grid lines 17 and the first electrode lines 4 do not intersect or overlap in the direction perpendicular to the plane where the substrate is located.

The grid lines and the second electrode lines intersect or overlap in the direction perpendicular to the plane where the substrate is located. Accordingly, the overlapping part of them generates a parasitic capacitance therebetween, which affects the signal quality. In order to reduce the parasitic capacitance, the grid lines may be provided with hollow-out regions H shown in FIG. 13. In other words, some areas of the parts of the grid lines overlapped with the second electrode lines are excavated, to reduce the overlapping area of them, to reduce the parasitic capacitance.

The grid electrode of the transistor may be the part of the grid line that intersects or overlaps with the active layer of the transistor in the direction perpendicular to the plane where the substrate is located, and may also be separately provided. In order to save the space and increase the aperture ratio, the former may be selected. FIGS. 3 and 6 illustrate by taking the former as an example.

The array base plate may control the voltages of the grid electrodes of the same one row of the transistors by using the grid lines, to in turn control the same one row of the transistors to be turned on or turned off, thereby controlling the voltage of the second electrode.

Optionally, referring to FIGS. 3 and 6, the array base plate further includes: a plurality of data lines 18 arranged in the second direction (the direction OB), wherein the orthographic projections of the data lines 18 on the substrate are disposed between the orthographic projections on the substrate of two neighboring rows of the first electrodes 3 that are arranged in the second direction, and the data lines are electrically connected to the second terminals 152 of the same one row of the transistors; and the data lines and the second electrode lines do not intersect or overlap in the direction perpendicular to the plane where the substrate is located.

The data lines may be arranged in the same layer as the first terminals and the second terminals of the transistors, and may also be separately provided, which is not limited herein. In order to save the time quantity of the patterning process, to reduce the production cost, the former may be selected.

The array base plate may provide a data voltage to the second terminals of the same one row of the transistors by using the data lines, and in turn provide the voltage to the second electrodes.

Optionally, in order to save the time quantity of the patterning process, to reduce the production cost, the grid lines and the first electrode lines are arranged in a same layer; and the data lines, the first terminals and the second terminals are arranged in a same layer.

The above-described arrangement in the same layer refers to that they are fabricated by using a one-step patterning process. The one-step patterning process refers to a process in which the required layer structure is formed by a single exposure. The one-step patterning process includes the processes of masking, exposure, development, etching, stripping and so on.

Optionally, the transistor is a bottom-grid-type transistor; and the first electrode lines are lap-joined to one side of the first electrodes in a same one row.

Referring to FIG. c in FIG. 4, the array base plate further includes a grid insulating layer 19, a first passivation layer 21 and a second passivation layer 22. Referring to FIG. c in FIG. 4 and FIG. c in FIG. 5, the grid insulating layer 19 covers the grid line 17, the first electrode line 4 and the part of the first electrode 3 that is not covered by the first electrode line 4; the first passivation layer 21 covers the data line 18 and the grid insulating layer 19; and the second passivation layer 22 covers the second electrode line 8 and the first passivation layer 21.

Referring to FIG. c in FIG. 4, the first via hole 5 extends throughout the first electrode line 4, the grid insulating layer 19, the first passivation layer 21 and the second passivation layer 22. Referring to FIG. d in FIG. 5, the second via hole 9 extends throughout the second electrode line 8 and the second passivation layer 22.

Referring to FIG. c in FIG. 4, the first electrode line 4 directly contacts one side of the first electrode 3 in the same one row, thereby realizing the electric connection between them.

The relative position relation between the first electrode line and the first electrode is not limited. As an example, the first electrode line is further from the substrate than the first electrode. Alternatively, the first electrode line is closer to the substrate than the first electrode. FIG. c in FIG. 4 illustrates by taking the former as an example.

The transistor includes the grid electrode, the active layer and an electrode layer that are arranged in layer configuration sequentially. The electrode layer includes the first terminal and the second terminal. In order to prevent mutual influence between the active layer and the grid electrode, the grid insulating layer is disposed between the active layer and the grid electrode. The first passivation layer (also referred to as a PVX1 layer) may also cover the first terminal and the second terminal. The materials of the second passivation layer (also referred to as a PVX2 layer) and the first passivation layer may be the same, and may also be different. In order to save the cost, they may be fabricated by using the same material, for example, silicon nitride, silicon oxide and silicon oxynitride. Silicon nitride is mostly selected.

The array base plate has a simple structure, and can be easily implemented.

Optionally, the first electrode includes a plate-shaped electrode shown in FIG. 2, and the second electrode includes a strip-shaped electrode shown in FIG. 3. Accordingly, the first electrode and the second electrode can form a multi-dimensional electric field therebetween, which facilitates to control the deflection of the liquid crystal.

Referring to FIG. 3, the second electrode 16 may include a plurality of parallel strip-shaped electrodes, the neighboring strip-shaped electrodes have a slit therebetween, and the same ends of all of the strip-shaped electrodes are connected together.

In one or more embodiments, referring to FIG. 2, the sub-pixel further includes a plurality of connecting electrodes 30, and the connecting electrodes and the second electrodes are arranged in a same layer.

The plurality of first electrode lines are divided into a first group and a second group, wherein the first electrode lines of the first group and the first electrode lines of the second group are arranged alternately in the first direction; and the connecting electrodes are configured for electrically connecting the first electrodes electrically connected to the first electrode lines of the first group to first electrode lines of the second group neighboring the first group.

The quantity of the connecting electrodes is not limited herein. As an example, two neighboring rows of the first electrodes may be electrically connected by one connecting electrode. In order to improve the reliability, referring to FIG. 2, two neighboring rows of the first electrodes may also be electrically connected by two connecting electrodes.

The connecting electrodes and the second electrodes are arranged in a same layer. Referring to FIG. 2, the connecting electrode 30 may be electrically connected to the first electrode 3 by a first connecting via hole (the small black dot 31 overlapped with the first electrode shown in FIG. 1), and connected to the first electrode line 4 by a second connecting via hole (the small black dot 32 overlapped with the first electrode line shown in FIG. 1).

It should be noted that the two neighboring touch-controlling units that are arranged in the first direction are independent of each other, and do not have the relation of electric connection. In the actual fabrication, all of the first electrodes of any two neighboring rows that are arranged in the first direction are correspondingly provided with the connecting electrodes therebetween. In order to prevent electric connection between the first electrodes of two neighboring touch-controlling units, optionally, merely the first connecting via holes are disposed, or merely the second connecting via hole 32 is provided within the region S2 shown in FIG. 2, whereby the connecting electrode corresponding to the region between the two neighboring touch-controlling units is ineffective.

In the array base plate, the two neighboring rows of the first electrodes are electrically connected by the connecting electrodes, thereby realizing the electric connection of the first electrodes of all of the sub-pixels in the touch-controlling unit. The structure is simple and easy to implement, and facilitates to save the space and increase the aperture ratio.

An embodiment of the present application further provides a display panel, wherein the display panel includes the array base plate stated above.

The display panel may be an ADS-type or HADS-type liquid-crystal touch-controlled display panel, and any products or components having a displaying function that include the display panel, such as a television set, a digital camera, a mobile phone and a tablet personal computer and so on. The display panel has the characteristics such as a high yield, a high response speed, a low cost and excellent displayed frames.

An embodiment of the present application further provides a method for preparing the array base plate. The structure of the array base plate may refer to FIGS. 3 and 6. The method includes:

S01: referring to FIG. 13, on the substrate, forming the plurality of first electrodes 3 arranged in an array.

The material of the first electrodes may include a transparent metal oxide, for example, ITO (Indium Tin Oxide). The material of the substrate may be a rigid material, for example, glass.

S02: forming the plurality of driving electrode lines.

The driving electrode lines may include first electrode lines and/or second electrode lines.

The driving electrode lines formed in the step S02 are continuous, and do not have a disconnection. Its material may include a metal, for example, copper, aluminum and silver and so on.

S03: forming a plurality of lines to be detected, wherein the lines to be detected include the grid lines and/or the data lines.

The lines to be detected may include grid lines. Alternatively, the lines to be detected may include data lines. Alternatively, the lines to be detected may include grid lines and data lines.

S04: detecting the lines to be detected.

It should be noted that, if the lines to be detected include grid lines, then the step S04 refers to detecting the grid lines. Because the driving electrode lines are continuous, they can normally load the testing signals. Therefore, the detection on the grid lines can be realized, and in turn GCS-type imperfects can be detected, thereby repairing the imperfects, to improve the product yield.

If the lines to be detected include data lines, then the step S04 refers to detecting the data lines. Because the driving electrode lines are continuous, they can normally load the testing signals. Therefore, the detection on the data lines can be realized, and in turn DCS-type imperfects can be detected, thereby repairing the imperfects, to improve the product yield.

If the lines to be detected include grid lines and data lines, then the step S04 refers to detecting the grid lines and the data lines. Because the driving electrode lines are continuous, they can normally load the testing signals. Therefore, the detection on the data lines and the data lines can be realized, and in turn GCS-type and DCS-type imperfects can be detected, thereby repairing the imperfects, to improve the product yield. It should be noted that the grid lines and the data lines are generally required to be formed by using two times of process, and the step S04 may include two times of detection. As an example, if the grid lines are formed firstly and the data lines are formed subsequently, then this step may include, after the grid lines are formed, detecting the grid lines; subsequently, forming the data lines; and, after the data lines are formed, detecting the data lines.

S05: when the lines to be detected are at a normal detected state, forming the plurality of isolating via holes and the plurality of isolating and insulating parts, wherein the isolating via holes are disposed at the boundaries between the two neighboring touch-controlling units that are arranged in the direction of the driving electrode lines, and the driving electrode lines are discontinuous at positions where the isolating via holes are located; and each of the isolating and insulating parts is disposed inside one of the isolating via holes, and fills and levels up the isolating via hole.

It should be noted that, if the lines to be detected include grid lines, then the step S05 is executed when the grid lines are at a normal detected state. If the lines to be detected include data lines, then the step S05 is executed when the data lines are at a normal detected state. If the lines to be detected include grid lines and data lines, then the step S05 is executed when all of the grid lines and the data lines are at a normal detected state.

The sequence of the execution of the steps S01-S03 is not limited. As an example, they may be executed sequentially in the order of the step S01, the step S02 and the step S03. Alternatively, they may also be executed sequentially in the order of the step S02, the step S01 and the step S03. Alternatively, they may also be executed sequentially in the order of the step S03, the step S01 and the step S02. Certainly, there may also be other execution sequences, which are not listed in detail herein.

The step S04 is required to be executed only after all of the steps S01-S03 are completely executed. The step S05 is required to be executed only after the step S04 has been completely executed. In addition, after the step S04, if an imperfect emerges, the method may further include the step S041 of repairing the imperfect, and the step S042 of detecting again the lines that are repaired. The steps S041 and S042 are continuously repeated, till the lines to be detected are at a normal detected state, and subsequently the subsequent steps continue to be executed.

The particular methods for forming the isolating via holes and the isolating and insulating parts are not limited herein.

By executing the steps S01-S05, in an aspect, the detection and repairing of GCS-type and/or DCS-type imperfects can be ensured, thereby improving the product yield and reducing the production cost, and, in another aspect, the realizing of the function of touch controlling can be ensured. The method is simple and easy to implement, which facilitates mass production.

It should be noted that the description on the structure of the array base plate involved in the preparing method may refer to the above-described embodiments, and is not discussed herein further.

A particular method for preparing the first via holes and the first insulating parts will be provided below.

In one or more embodiments, the step of S02 of forming the plurality of driving electrode lines includes: S021: referring to FIG. 13, forming the plurality of first electrode lines 4 arranged in the first direction.

The step of S05 of, when the lines to be detected are at the normal detected state, forming the plurality of isolating via holes and the plurality of isolating and insulating parts includes:

S051: by using an etching process, removing film layers at the boundaries between two neighboring touch-controlling units that are arranged in the second direction, and exposing parts of the first electrode lines that are required to be broken.

Particularly, a wet etching process or a dry etching process may be used, which is not limited herein.

S052: by using wet etching, removing the parts of the first electrode lines that are required to be broken, and forming the first via holes, wherein the first via holes are disposed at the boundaries between the two neighboring touch-controlling units that are arranged in the second direction, and the first electrode lines are discontinuous at the positions where the first via holes are located.

S053: by using a one-step patterning process, forming the first insulating parts and the alignment layer, wherein each of the first insulating parts is disposed inside one of the first via holes, and fills and levels up the first via hole.

By executing the steps S051-S053, the formed first insulating parts and alignment layer are of an integral structure. At the same time, by the two times of etching, the first via holes are formed.

Another particular method for preparing the first via holes and the first insulating parts will be provided below.

In one or more embodiments, the step of S02 of forming the plurality of driving electrode lines includes: S021: referring to FIG. 13, forming the plurality of first electrode lines 4 arranged in the first direction.

S05: the step of, when the lines to be detected are at the normal detected state, forming the plurality of isolating via holes and the plurality of isolating and insulating parts includes:

S055: by using an etching process, removing film layers at the boundaries between two neighboring touch-controlling units that are arranged in the second direction, and exposing parts of the first electrode lines that are required to be broken.

S056: by using oxygen-containing-gas etching, removing the parts of the first electrode lines that are required to be broken, and forming the first via holes and the first insulating sub-parts.

Particularly, an etching gas of a high oxygen content (for example, SF6/O2) may be used for the etching. The first electrode lines are fabricated by using a metal such as copper, and the metal reacts with the etching gas, to form a metal oxidized chelate (for example, copper oxidized chelate). The metal chelate has the characteristics of a high impedance and no electric conductivity. The metal chelate can form the first insulating sub-parts.

S057: by using a one-step patterning process, forming the second insulating sub-parts and the alignment layer.

By executing the steps S055-S057, each of the formed first insulating parts includes the first insulating sub-part and the second insulating sub-part, the first insulating sub-part is located at one of the disconnection points of the first electrode lines, the second insulating sub-part is disposed on one side of the first insulating sub-part that is away from the substrate, and the second insulating sub-part and the alignment layer are of an integral structure. At the same time, by the two times of etching, the first via holes are formed.

In one or more embodiments, the step of S02 of forming the plurality of driving electrode lines further includes: S06: forming the plurality of second electrode lines arranged in the second direction.

The method for preparing the array base plate further includes: S07: when the first electrode lines are continuous, detecting the second electrode lines.

It should be noted that the step S05 can be executed only after the step S07 is completely executed. In other words, when the second electrode lines are being detected, it is required to ensure that the first electrode lines are in a continuous and un-disconnected state. That can ensure that the imperfects such as TCS, TTS, TOP and TGS can be detected, and accurately located repairing can be realized.

In addition, after the step S07, if an imperfect emerges, the method may further include the step S071 of repairing the imperfect, and the step S072 of detecting again the lines that are repaired. The steps S071 and S072 are continuously repeated, till the second electrode lines are at a normal detected state, and subsequently the subsequent steps continue to be executed.

S08: when the second electrode lines are at a normal detected state, forming the plurality of second via holes and the plurality of second insulating parts, wherein each of the second via holes is disposed at the boundary between the two neighboring touch-controlling units that are arranged in the first direction, and the second electrode lines are discontinuous at positions where the second via holes are located; the second via holes and the first via holes do not intersect or overlap in a direction perpendicular to a plane where the substrate is located; and each of the second insulating parts is disposed inside one of the second via holes, and fills and levels up the second via hole.

It should be noted that the sequence of the execution of the step S06 and the steps S01, S03, S04 and S021 is not limited. As an example, the steps S06, S07, S05 and S08 may be executed sequentially after all of the steps S1, S03, S04 and S021 are executed completely. Alternatively, the steps S06, S07, S08 and S05 may be executed sequentially after all of the steps S01, S03, S04 and S021 are executed completely. Certainly, there may also be other execution sequences, which are not listed in detail herein.

By executing the steps S06-S08, in an aspect, the detection and the accurately located repairing of the imperfects such as TCS, TTS, TOP and TGS can be ensured, and, in another aspect, the realizing of the function of touch controlling and the split-screen controlling can be ensured. The method is simple and easy to implement, which facilitates mass production.

A particular method for preparing the second via holes and the second insulating parts will be provided below.

The step of S08 of, when the second electrode lines are at the normal detected state, forming the plurality of second via holes and the plurality of second insulating parts includes:

S081: by using an etching process, removing film layers at the boundaries between two neighboring touch-controlling units that are arranged in the first direction, and exposing parts of the second electrode lines that are required to be broken.

Particularly, a wet etching process or a dry etching process may be used, which is not limited herein.

S082: by using wet etching, removing the parts of the second electrode lines that are required to be broken, and forming the second via holes.

S083: by using a one-step patterning process, forming the second insulating parts and the alignment layer.

By executing the steps S081-S083, the formed second insulating parts and alignment layer are of an integral structure. At the same time, by the two times of etching, the second via holes are formed.

Another particular method for preparing the second via holes and the second insulating parts will be provided below.

The step of S08 of, when the second electrode lines are at the normal detected state, forming the plurality of second via holes and the plurality of second insulating parts includes:

S085: by using an etching process, removing film layers at the boundaries between two neighboring touch-controlling units that are arranged in the first direction, and exposing parts of the second electrode lines that are required to be broken.

Particularly, a wet etching process or a dry etching process may be used, which is not limited herein.

S086: by using oxygen-containing-gas etching, removing the parts of the second electrode lines that are required to be broken, and forming the second via holes and the third insulating sub-parts.

Particularly, an etching gas of a high oxygen content (for example, SF6/O2) may be used for the etching. The second electrode lines are fabricated by using a metal such as copper, and the metal reacts with the etching gas, to form a metal oxidized chelate (for example, copper oxidized chelate). The metal chelate has the characteristics of a high impedance and no electric conductivity. The metal chelate can form the third insulating sub-parts.

S087: by using a one-step patterning process, forming the fourth insulating sub-parts and the alignment layer.

By executing the steps S085-S087, each of the formed second insulating parts includes the third insulating sub-part and the fourth insulating sub-part, the third insulating sub-part is located at one of the disconnection points of the first electrode line, the fourth insulating sub-part is disposed on one side of the third insulating sub-part that is away from the substrate, and the fourth insulating sub-part and the alignment layer are of an integral structure. At the same time, by the two times of etching, the second via holes are formed.

The preparing method will be described particularly below by taking the structure shown in FIGS. 3 and 6 as an example. The method includes:

S100: referring to FIG. 13, on the substrate, forming the plurality of first electrodes 3 arranged in an array.

Particularly, this step may include firstly depositing a layer of ITO thin film on the substrate, subsequently disposing a mask, subsequently etching, and finally stripping the mask, to complete the patterning, and form the plurality of first electrodes arranged in an array.

S101: referring to FIG. 13, forming a plurality of grid lines 17 arranged in the first direction and a plurality of first electrode lines 4 arranged in the first direction.

Particularly, the grid lines and the first electrode lines may be formed by using a one-step patterning process. In other words, this step may include firstly depositing a metal thin film, subsequently disposing a mask, subsequently etching, and finally stripping the mask, to complete the patterning, and form the plurality of grid lines and the plurality of first electrode lines. The first electrode lines are parallel to a row of the first electrodes that are arranged in the second direction, and at least part of the orthographic projections of the first electrode lines on the substrate are disposed between the orthographic projections on the substrate of two neighboring rows of the first electrodes that are arranged in the first direction. The first electrode lines are lap-joined to one side of the first electrodes in a same one row; in other words, the first electrode lines and the same one row of the first electrodes realize the electric connection by direct contacting. The orthographic projections of the grid lines on the substrate are disposed between the orthographic projections on the substrate of two neighboring rows of the first electrodes that are arranged in the first direction, and the grid lines and the first electrode lines do not intersect or overlap in the direction perpendicular to the plane where the substrate is located.

The first electrode lines formed in the step S101 are continuous.

S102: detecting the grid lines.

Because the first electrode lines formed in the step S101 are continuous, they can normally load the testing signals. In turn, GCS-type imperfects can be detected, thereby repairing the imperfects, to improve the product yield.

S103: when the grid lines are at a normal detected state, forming a grid insulating layer.

Particularly, the grid insulating layer may be deposited. The grid insulating layer covers the grid lines, the first electrode lines and the part of the first electrode that is not covered by the first electrode line.

S104: forming an active layer.

Particularly, the active layer is formed over the grid lines. As an example, this step may include sequentially depositing an amorphous-silicon thin film and an ohmic contact thin film (wherein the ohmic contact thin film refers to an amorphous-silicon thin film doped by an N+ material), subsequently disposing a mask, subsequently etching, and finally stripping the mask, thereby forming an amorphous-silicon semiconductor layer and an ohmic contact layer, which is described herein by taking the case as an example in which an amorphous-silicon transistor is formed. The part of the grid line that intersects or overlaps with the active layer in the direction perpendicular to the plane where the substrate is located is used as the grid electrode.

S105: forming first terminals, second terminals and data lines.

Particularly, this step may include firstly depositing a metal thin film, subsequently disposing a mask, subsequently etching the metal thin film, subsequently etching the ohmic contact layer, and finally stripping the mask, thereby forming the first terminals, the second terminals and the data lines. An ohmic contact layer is disposed between the first terminals and the amorphous-silicon semiconductor layer, an ohmic contact layer is disposed between the second terminals and the amorphous-silicon semiconductor layer, and the ohmic contact layers under them are discontinuous. Referring to FIG. 1, the data line is directly connected to the U-shaped second terminal, to realize the electric connection.

S106: detecting the data lines.

Because the first electrode lines formed in the step S101 are continuous, they can normally load the testing signals. In turn, DCS-type imperfects can be detected, and, accordingly, when the grid lines are at a normal detected state, the grid insulating layer is formed, thereby repairing the imperfects, to improve the product yield.

S107: when the data lines are at a normal detected state, forming a first passivation layer.

Particularly, a silicon nitride material may be deposited to form the first passivation layer. The first passivation layer covers the data lines, the grid insulating layer, the first terminals and the second terminals.

S108: forming second electrode lines.

The second electrode lines formed in the step S108 are continuous. The orthographic projections of the second electrode lines on the substrate are disposed between the orthographic projections on the substrate of two neighboring rows of the first electrodes that are arranged in the second direction, and the second electrode lines are electrically connected to at least one of the first electrodes that belong to a same one touch-controlling unit.

S109: detecting the second electrode lines.

Because the second electrode lines formed in the step S108 are continuous, and the first electrode lines formed in the step S101 are continuous, they can normally load the testing signals, thereby ensuring that the imperfects such as TCS, TTS, TOP and TGS can be detected, and accurately located repairing can be performed.

S110: when the second electrode lines are at a normal detected state, forming a second passivation layer, thereby forming the structure shown in FIG. a in FIG. 4 and FIG. a in FIG. 5, or the structure shown in FIG. a in FIG. 7 and FIG. a in FIG. 8.

A second planarization layer formed in the step S110 covers the second electrode line and a first planarization layer.

S111: forming a plurality of first via holes, a plurality of second via holes, a plurality of first insulating parts, a plurality of second insulating parts, a pixel electrode and an alignment layer.

A particular preparing method of the step S111 will be provided below. When the first insulating part and the second insulating part individually include merely one layer, referring to FIGS. 4 and 5, the step S111 includes:

S121: referring to FIG. b in FIG. 4, by using an etching process, removing the second passivation layer 22, the first passivation layer 21 and the grid insulating layer 19 at the boundary between two neighboring touch-controlling units that are arranged in the second direction, and exposing the part of the first electrode line 4 that is required to be broken.

Particularly, a wet etching process or a dry etching process may be used, which is not limited herein.

S122: referring to FIG. b in FIG. 5, by using an etching process, removing the second passivation layer 22 at the boundary between two neighboring touch-controlling units that are arranged in the first direction, and exposing the part of the second electrode line 8 that is required to be broken.

Particularly, a wet etching process or a dry etching process may be used, which is not limited herein.

S123: referring to FIG. c in FIG. 4 and FIG. c in FIG. 5, by using wet etching, removing the parts of the first electrode line 4 and the second electrode line 8 that are required to be broken, and forming the first via hole 5 and the second via hole 9.

It should be noted that, after the first via hole and the second via hole are formed, other connecting via holes can be formed, for example, a first connecting via hole and a second connecting via hole, or the second electrode via hole 33 shown in FIG. 3 or 6.

S124: referring to FIG. d in FIG. 5, forming the second electrode 16, wherein the orthographic projection of the second electrode on the substrate is located within the orthographic projection of the first electrode on the substrate, and the material of the second electrode may be ITO; and the second electrode is electrically connected to the first terminal of the transistor by the second electrode via hole.

It should be noted that, in the step S124, the connecting electrodes may also be formed at a same time, wherein the connecting electrodes electrically connect two neighboring rows of the first electrodes via the first connecting via hole and the second connecting via hole, thereby realizing the electric connection of the first electrodes of all of the sub-pixels in the touch-controlling unit.

S125: referring to FIG. d in FIG. 4 and FIG. e in FIG. 5, by using a one-step patterning process, forming the first insulating part 6, the second insulating part 10 and the alignment layer 7, wherein each of the first insulating parts is disposed inside one of the first via holes, and fills and levels up the first via hole; each of the second insulating parts is disposed inside one of the second via holes, and fills and levels up the second via hole; and the alignment layer covers the second electrode and the second passivation layer.

The sequence of the execution of the steps S121 and S122 is not limited. As an example, the step S121 may be executed firstly and subsequently the step S122 is executed. Alternatively, the step S122 may be executed firstly and subsequently the step S121 is executed. Alternatively, the step S121 may include firstly etching the second passivation layer, and subsequently etching the first passivation layer and the grid insulating layer, wherein the step of etching the second passivation layer in the step S121 may be executed with the step S122 at a same time. Certainly, there may also be other execution sequences, which are not listed in detail herein.

Another particular preparing method of the step S111 will be provided below. When the first insulating part includes the first insulating sub-part and the second insulating sub-part, and the second insulating part includes the third insulating sub-part and the fourth insulating sub-part, referring to FIGS. 7 and 8, the step S111 includes:

S221: referring to FIG. b in FIG. 7, by using an etching process, removing the second passivation layer 22, the first passivation layer 21 and the grid insulating layer 19 at the boundary between two neighboring touch-controlling units that are arranged in the second direction, and exposing the part of the first electrode line 4 that is required to be broken.

Particularly, a wet etching process or a dry etching process may be used, which is not limited herein.

S222: referring to FIG. b in FIG. 8, by using an etching process, removing the second passivation layer 22 at the boundary between two neighboring touch-controlling units that are arranged in the first direction, and exposing the part of the second electrode line 8 that is required to be broken.

Particularly, a wet etching process or a dry etching process may be used, which is not limited herein.

S223: referring to FIG. c in FIG. 7 and FIG. c in FIG. 8, by using oxygen-containing-gas etching, removing the parts of the first electrode line 4 and the second electrode line 8 that are required to be broken, and forming the first via hole 5, the first insulating sub-part 11, the second via hole 9 and the third insulating sub-part 13.

Particularly, an etching gas of a high oxygen content (for example, SF6/O2) may be used for the etching. The first electrode line and the second electrode line may be fabricated by using a metal such as copper, and the metal reacts with the etching gas, to form a metal oxidized chelate (for example, copper oxidized chelate). The metal chelate has the characteristics of a high impedance and no electric conductivity. The metal chelate can form the first insulating sub-part and the third insulating sub-part.

It should be noted that, after the first via hole and the second via hole are formed, other connecting via holes can be formed, for example, a first connecting via hole and a second connecting via hole, or the second electrode via hole 33 shown in FIG. 3 or 6.

S224: referring to FIG. d in FIG. 8, forming the second electrode 16, wherein the orthographic projection of the second electrode on the substrate is located within the orthographic projection of the first electrode on the substrate, and the material of the second electrode may be ITO; and the second electrode is electrically connected to the first terminal of the transistor by the via hole.

It should be noted that, in the step S224, the connecting electrodes may also be formed at a same time, wherein the connecting electrodes electrically connect two neighboring rows of the first electrodes via the first connecting via hole and the second connecting via hole, thereby realizing the electric connection of the first electrodes of all of the sub-pixels in the touch-controlling unit.

S225: referring to FIG. d in FIG. 7 and FIG. e in FIG. 8, by using a one-step patterning process, forming the second insulating sub-part 12, the fourth insulating sub-part 14 and the alignment layer 7, wherein the second insulating sub-part is disposed inside the first via hole, and fills and levels up the first via hole together with the first insulating sub-part; the fourth insulating sub-part is disposed inside the second via hole, and fills and levels up the second via hole together with the third insulating sub-part; and the alignment layer covers the second electrode and the second passivation layer.

The sequence of the execution of the steps S221 and S222 is not limited. As an example, the step S221 may be executed firstly and subsequently the step S222 is executed. Alternatively, the step S222 may be executed firstly and subsequently the step S221 is executed. Alternatively, the step S221 may include firstly etching the second passivation layer, and subsequently etching the first passivation layer and the grid insulating layer, wherein the step of etching the second passivation layer in the step S221 may be executed with the step S222 at a same time. Certainly, there may also be other execution sequences, which are not listed in detail herein.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

Finally, it should be noted that the above embodiments are merely intended to explain the technical solutions of the present application, and not to limit them. Although the present application is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. An array base plate, wherein the array base plate comprises: a substrate; a plurality of touch-controlling units that are disposed on the substrate and are arranged in an array, wherein each of the touch-controlling units comprises a plurality of sub-pixels arranged in an array; each of the sub-pixels comprises a first electrode; the first electrodes of all of the sub-pixels of the touch-controlling units are electrically connected; and the first electrodes are configured for being used as driving electrodes at a displaying stage, and used as touch-controlling sensing electrodes at a touch-controlling stage; a plurality of driving electrode lines, wherein at least part of orthographic projections of the driving electrode lines on the substrate are disposed between orthographic projections on the substrate of two neighboring rows of the first electrodes, and the driving electrode lines are electrically connected to at least one of the first electrodes; in the two neighboring rows of the first electrodes, all of the rows of the first electrodes are arranged in a direction of the driving electrode lines; each of the driving electrode lines comprises one or more disconnection points, and the disconnection points of the driving electrode lines are located at boundaries between two neighboring touch-controlling units that are arranged in the direction of the driving electrode lines; and the driving electrode lines are configured for transmitting driving signals at the displaying stage, and transmitting touch-controlling signals at the touch-controlling stage; one or more isolating via holes, wherein the isolating via holes are disposed at the boundaries between the two neighboring touch-controlling units that are arranged in the direction of the driving electrode lines, and expose the disconnection points of the driving electrode lines; one or more isolating and insulating parts, wherein each of the isolating and insulating parts is disposed inside one of the isolating via holes, and fills and levels up the isolating via hole; wherein the driving electrode lines comprise first electrode lines; the isolating via holes comprise first via holes; the isolating and insulating parts include first insulating parts; a plurality of the first electrode lines are arranged in a first direction, the first electrode lines are parallel to a row of the first electrodes that are arranged in a second direction, at least part of orthographic projections of the first electrode lines on the substrate are disposed between orthographic projections on the substrate of two neighboring rows of the first electrodes that are arranged in the first direction, and the first electrode lines are electrically connected to the first electrodes in a same one row; each of the first electrode lines comprises a plurality of the disconnection points, and the disconnection points of the first electrode lines are located at boundaries between any two neighboring touch-controlling units that are arranged in the second direction; the second direction intersects with the first direction; the first via holes are disposed at the boundaries between the two neighboring touch-controlling units that are arranged in the second direction, and expose the disconnection points of the first electrode lines; and each of the first insulating parts is disposed inside one of the first via holes, and fills and levels up the first via hole.

2. The array base plate according to claim 1, wherein the array base plate further comprises an alignment layer, and the alignment layer covers the plurality of touch-controlling units; and the alignment layer and the first insulating parts are of an integral structure.

3. The array base plate according to claim 1, wherein the array base plate further comprises an alignment layer, and the alignment layer is disposed on one side of the touch-controlling units that is away from the substrate, and covers the plurality of touch-controlling units; each of the first insulating parts comprises a first insulating sub-part and a second insulating sub-part, the first insulating sub-part is located at one of the disconnection points of the first electrode lines, and the second insulating sub-part is disposed on one side of the first insulating sub-part that is away from the substrate; and the alignment layer and the second insulating sub-part are of an integral structure.

4. The array base plate according to claim 1, wherein the driving electrode lines comprise second electrode lines;
the isolating via holes comprise second via holes;
the isolating and insulating parts comprise second insulating parts;
a plurality of the second electrode lines are arranged in the second direction, and orthographic projections of the second electrode lines on the substrate are disposed between orthographic projections on the substrate of two neighboring rows of the first electrodes that are arranged in the second direction, and the second electrode lines are electrically connected to at least one of the first electrodes that belong to a same one touch-controlling unit;
each of the second electrode lines comprises a disconnection point, and the disconnection point of the second electrode line is located at a boundary between two neighboring touch-controlling units that are arranged in the first direction;
each of the second via holes is disposed at the boundary between the two neighboring touch-controlling units that are arranged in the first direction, and exposes the disconnection point of the second electrode line;
the second via holes and the first via holes do not intersect or overlap in a direction perpendicular to a plane where the substrate is located; and
each of the second insulating parts is disposed inside one of the second via holes, and fills and levels up the second via hole.

5. The array base plate according to claim 4, wherein the array base plate further comprises an alignment layer, and the alignment layer covers the plurality of touch-controlling units; and
the alignment layer and the second insulating parts are of an integral structure.

6. The array base plate according to claim 4, wherein the array base plate further comprises a substrate and an alignment layer, and the alignment layer is disposed on one side of the touch-controlling units that is away from the substrate, and covers the plurality of touch-controlling units;
each of the second insulating parts comprises a third insulating sub-part and a fourth insulating sub-part, the third insulating sub-part is located at one of the disconnection points of the second electrode lines, and the fourth insulating sub-part is disposed on one side of the third insulating sub-part that is away from the substrate; and
the alignment layer and the fourth insulating sub-part are of an integral structure.

7. The array base plate according to claim 4, wherein the disconnection points of the plurality of second electrode lines are arranged in the second direction, and the plurality of second via holes are arranged in the second direction.

8. The array base plate according to claim 4, wherein each of the sub-pixels further comprises a transistor and a second electrode;
the transistor does not intersect or overlap with the first electrode line, the first electrode and the second electrode line in the direction perpendicular to the plane where the substrate is located;
the transistor comprises a grid electrode, a first terminal and a second terminal;
an orthographic projection of the second electrode on the substrate and an orthographic projection of the first electrode on the substrate at least partially intersect or overlap; and
the second electrode is electrically connected to the first terminal, and is configured for, at the displaying stage, forming an electric field with the first electrode.

9. The array base plate according to claim 8, wherein the array base plate further comprises:
a plurality of grid lines arranged in the first direction, wherein orthographic projections of the grid lines on the substrate are disposed between orthographic projections on the substrate of two neighboring rows of the first electrodes that are arranged in the first direction, and the grid lines are electrically connected to the grid electrodes of the transistors in a same one row; and the grid lines and the first electrode lines do not intersect or overlap in the direction perpendicular to the plane where the substrate is located.

10. The array base plate according to claim 9, wherein the array base plate further comprises:
a plurality of data lines arranged in the second direction, wherein orthographic projections of the data lines on the substrate are disposed between orthographic projections on the substrate of two neighboring rows of the first electrodes that are arranged in the second direction, and the data lines are electrically connected to the second terminals of the transistors in a same one row; and the data lines and the second electrode lines do not intersect or overlap in the direction perpendicular to the plane where the substrate is located.

11. The array base plate according to claim 10, wherein the grid lines and the first electrode lines are arranged in a same layer; and
the data lines, the first terminals and the second terminals are arranged in a same layer.

12. The array base plate according to claim 11, wherein the transistor is a bottom-grid-type transistor;
the first electrode lines are lap-joined to one side of the first electrodes in a same one row;
the array base plate further comprises a grid insulating layer, a first passivation layer and a second passivation layer;
the grid insulating layer covers the grid line, the first electrode line and a part of the first electrode that is not covered by the first electrode line;
the first passivation layer covers the data line and the grid insulating layer;
the second passivation layer covers the second electrode line and the first passivation layer;
the first via hole extends throughout the first electrode line, the grid insulating layer, the first passivation layer and the second passivation layer; and
the second via hole extends throughout the second electrode line and the second passivation layer.

13. The array base plate according to claim 8, wherein the sub-pixel further comprises a plurality of connecting electrodes, and the connecting electrodes and the second electrodes are arranged in a same layer;

the plurality of first electrode lines are divided into a first group and a second group, wherein the first electrode lines of the first group and the first electrode lines of the second group are arranged alternately in the first direction; and the connecting electrodes are configured for electrically connecting the first electrodes electrically connected to the first electrode lines of the first group to the first electrode lines of the second group neighboring the first group.

14. A display panel, wherein the display panel comprises the array base plate according to claim 1.

15. A method for preparing the array base plate according to claim 10, wherein the method comprises:

forming the plurality of first electrodes arranged in an array;

forming the plurality of driving electrode lines;

forming a plurality of lines to be detected, wherein the lines to be detected comprise the grid lines and/or the data lines;

detecting the lines to be detected; and when the lines to be detected are at a normal detected state, forming the plurality of isolating via holes and the plurality of isolating and insulating parts, wherein the isolating via holes are disposed at the boundaries between the two neighboring touch-controlling units that are arranged in the direction of the driving electrode lines, and the driving electrode lines are discontinuous at positions where the isolating via holes are located; and each of the isolating and insulating parts is disposed inside one of the isolating via holes, and fills and levels up the isolating via hole.

16. The method according to claim 15, wherein the step of forming the plurality of driving electrode lines comprises: forming the plurality of first electrode lines arranged in the first direction; and the step of, when the lines to be detected are at the normal detected state, forming the plurality of isolating via holes and the plurality of isolating and insulating parts comprises:

by using an etching process, removing film layers at the boundaries between two neighboring touch-controlling units that are arranged in the second direction, and exposing parts of the first electrode lines that are required to be broken;

by using wet etching, removing the parts of the first electrode lines that are required to be broken, and forming the first via holes; and by using a one-step patterning process, forming the first insulating parts and the alignment layer.

17. The method according to claim 15, wherein the step of forming the plurality of driving electrode lines comprises: forming the plurality of first electrode lines arranged in the first direction; and the step of, when the lines to be detected are at the normal detected state, forming the plurality of isolating via holes and the plurality of isolating and insulating parts comprises:

by using an etching process, removing film layers at the boundaries between two neighboring touch-controlling units that are arranged in the second direction, and exposing parts of the first electrode lines that are required to be broken;

by using oxygen-containing-gas etching, removing the parts of the first electrode lines that are required to be broken, and forming the first via holes and the first insulating sub-parts; and by using a one-step patterning process, forming the second insulating sub-parts and the alignment layer.

18. The method according to claim 16, wherein the step of forming the plurality of driving electrode lines further comprises: forming the plurality of second electrode lines arranged in the second direction; and the method further comprises:

when the first electrode lines are continuous, detecting the second electrode lines; and when the second electrode lines are at a normal detected state, forming the plurality of second via holes and the plurality of second insulating parts, wherein each of the second via holes is disposed at the boundary between the two neighboring touch-controlling units that are arranged in the first direction, and the second electrode lines are discontinuous at positions where the second via holes are located; the second via holes and the first via holes do not intersect or overlap in a direction perpendicular to a plane where the substrate is located; and each of the second insulating parts is disposed inside one of the second via holes, and fills and levels up the second via hole.

19. The method according to claim 18, wherein the step of, when the second electrode lines are at the normal detected state, forming the plurality of second via holes and the plurality of second insulating parts comprises:

by using an etching process, removing film layers at the boundaries between two neighboring touch-controlling units that are arranged in the first direction, and exposing parts of the second electrode lines that are required to be broken;

by using wet etching, removing the parts of the second electrode lines that are required to be broken, and forming the second via holes; and by using a one-step patterning process, forming the second insulating parts and the alignment layer; or the step of, when the second electrode lines are at the normal detected state, forming the plurality of second via holes and the plurality of second insulating parts comprises:

by using an etching process, removing film layers at the boundaries between two neighboring touch-controlling units that are arranged in the first direction, and exposing parts of the second electrode lines that are required to be broken;

by using oxygen-containing-gas etching, removing the parts of the second electrode lines that are required to be broken, and forming the second via holes and the third insulating sub-parts; and by using a one-step patterning process, forming the fourth insulating sub-parts and the alignment layer.

* * * * *